United States Patent [19]
Kawamura et al.

[11] Patent Number: 5,785,879
[45] Date of Patent: Jul. 28, 1998

[54] MULTILAYER CERAMIC PARTS AND METHOD FOR MAKING

[75] Inventors: Keizou Kawamura, Narita; Makoto Kobayashi, Yotsukaido; Akira Nakamura, Narita; Norikazu Yasuda, Yokohama; Suguru Kondoh, Urawa; Taro Miura, Tokyo; Shinya Nakai, Ichikawa; Tadao Fujii, Yachiyo, all of Japan

[73] Assignee: TDK Corporation, Tokyo, Japan

[21] Appl. No.: 784,586

[22] Filed: Jan. 23, 1997

Related U.S. Application Data

[63] Continuation of Ser. No. 408,115, Mar. 21, 1995, abandoned, which is a continuation of Ser. No. 885,639, May 19, 1992, abandoned.

[51] Int. Cl.⁶ .................................................. B32B 18/00
[52] U.S. Cl. ........................... 216/95; 156/89; 264/614
[58] Field of Search .......................... 216/95; 156/89; 264/614, 615, 617, 619

[56] References Cited

U.S. PATENT DOCUMENTS

| | | | |
|---|---|---|---|
| 3,770,529 | 11/1973 | Anderson | 156/3 |
| 4,289,719 | 9/1981 | McIntosh | 264/61 |
| 4,985,098 | 1/1991 | Kohno | 156/89 |
| 4,994,215 | 2/1991 | Wiech, Jr. | 264/27 |
| 5,080,958 | 1/1992 | Patterson et al. | 428/209 |
| 5,081,070 | 1/1992 | Yokoyama | 428/901 |
| 5,110,654 | 5/1992 | Yokokawa | 428/901 |
| 5,147,484 | 9/1992 | Chance | 156/89 |
| 5,176,772 | 1/1993 | Ohtaki | 264/61 |
| 5,290,375 | 3/1994 | Nagasaka | 156/89 |
| 5,300,163 | 4/1994 | Ohtaki | 264/61 |
| 5,458,709 | 10/1995 | Kamezaki et al. | 156/89 |

FOREIGN PATENT DOCUMENTS

| | | |
|---|---|---|
| 0059851 | 9/1982 | European Pat. Off. . |
| 0059852 | 9/1982 | European Pat. Off. . |
| 0 244 696 | 11/1987 | European Pat. Off. . |
| 53-53774 | 5/1978 | Japan . |
| 57-143203 | 9/1982 | Japan . |
| 63-81894 | 4/1988 | Japan . |
| 2-197189 | 8/1990 | Japan . |

*Primary Examiner*—R. Bruce Breneman
*Assistant Examiner*—Michael E. Adjodha
*Attorney, Agent, or Firm*—Oblon, Spivak, McClelland, Maier & Neustadt, P.C.

[57] ABSTRACT

An object is to densify an internal conductor of a multilayer ceramic part to thereby reduce a line loss, improve operating properties such as Q value, and reduce a variation thereof. To this end, an internal conductor paste which is composed of conductor powder, preferably silver or copper powder and optionally, a glass frit is stacked with dielectric ceramic material layers and co-fired at or above the melting point of the conductor.

18 Claims, 16 Drawing Sheets

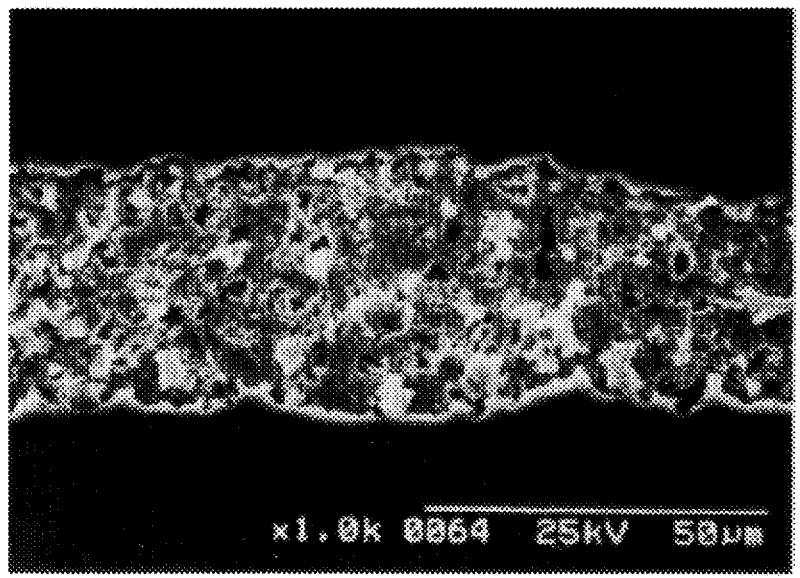
F I G. 11
F I G. 12

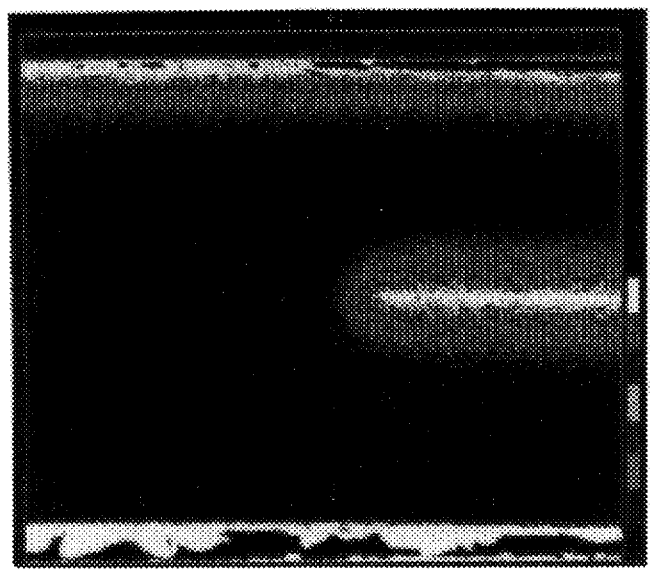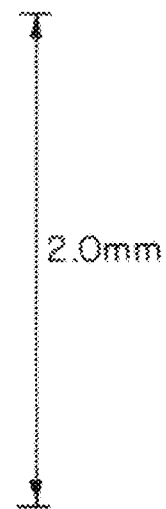
F I G. 15A
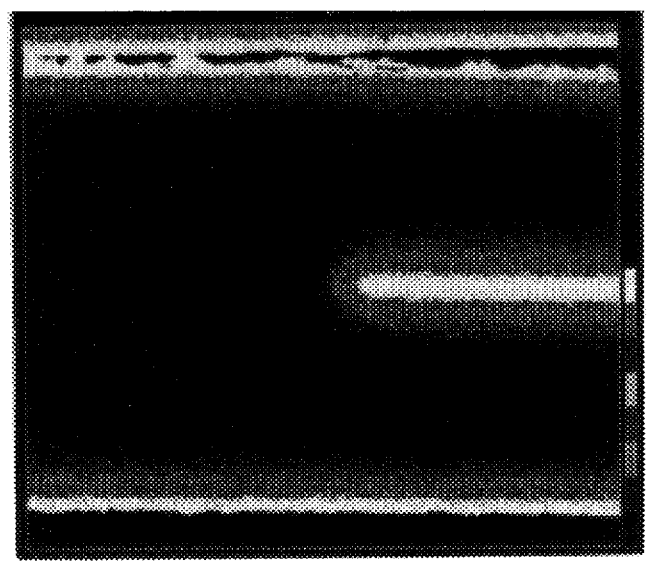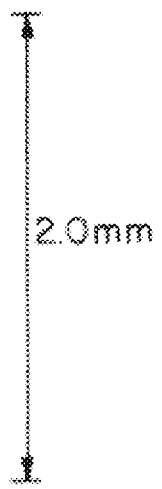
F I G. 15B

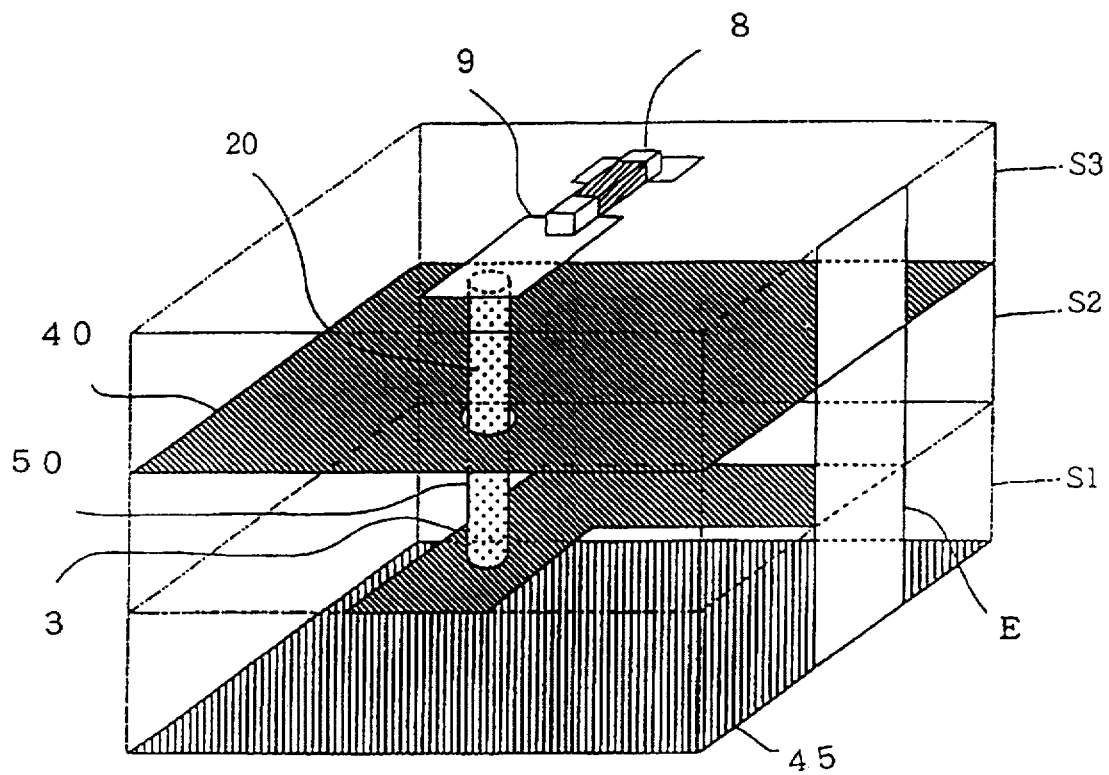
F I G. 17
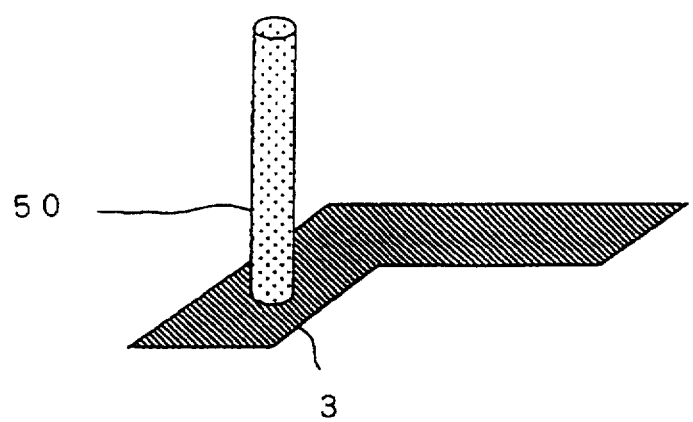
F I G. 18

F I G . 23
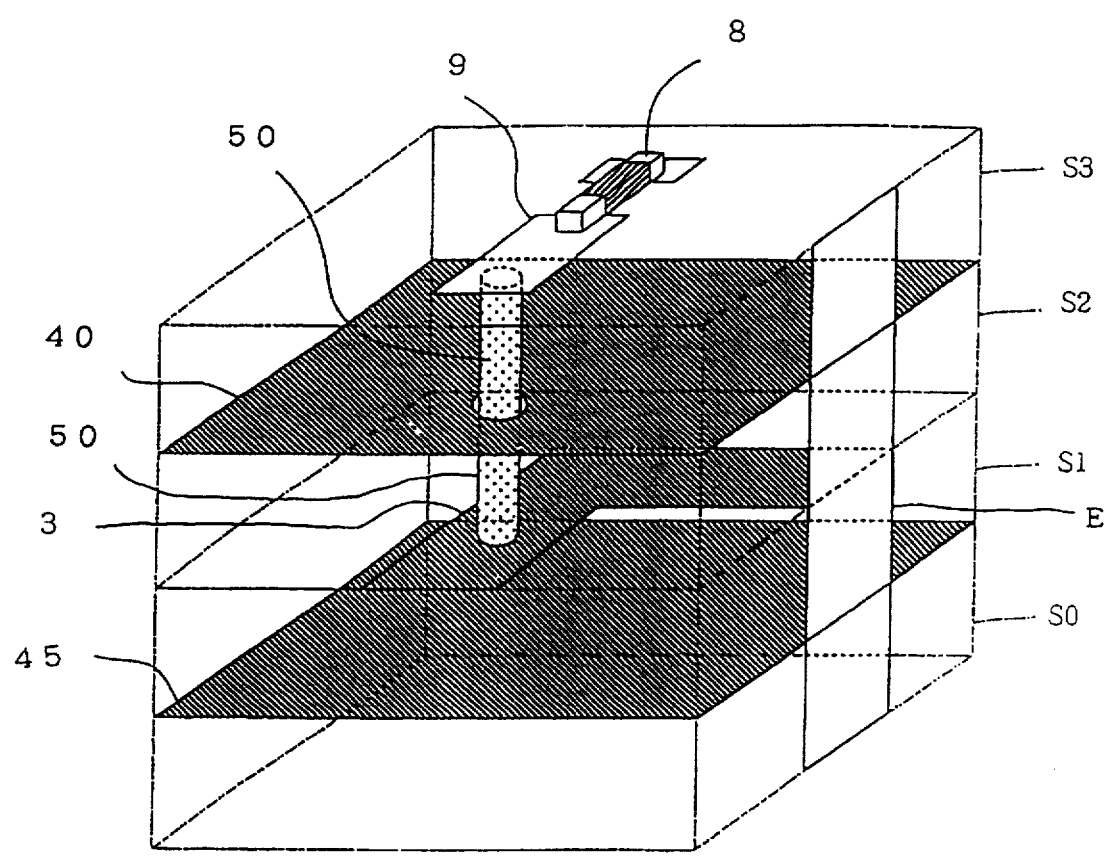

5,785,879

MULTILAYER CERAMIC PARTS AND METHOD FOR MAKING

This application is a Continuation of application Ser. No. 08/408,115, filed on Mar. 21, 1995, now abandoned; which is a Continuation of Ser. No. 07/885,639, filed on May 19, 1992, abandoned.

TECHNICAL FIELD

This invention relates to a method for preparing a multilayer ceramic part and the resultant multilayer ceramic part.

BACKGROUND OF THE INVENTION

For constructing functional blocks operating in a quasi-microwave band of about 100 MHz to 3 GHz and a high frequency band, an integrated circuit system using a multilayer ceramic substrate is known to be most effective in meeting the demand for reducing the size of functional parts and improving the reliability thereof. Such a multilayer ceramic substrate which is one of multilayer ceramic parts is prepared by printing an internal conductor paste on green sheets of dielectric material, stacking the green sheets, compression bonding and shaping the assembly using a hot press, and concurrently firing the dielectric material and the conductor.

The integrated circuit system using a multilayer ceramic substrate is utilized in a variety of functional parts. However, if the circuit substrate is used in a quasi-microwave circuit operating at a very high frequency by incorporating a resonator function therein, there occur several problems including the skin effect of the internal conductor which is negligible in a low frequency region, increased high-frequency resistance, an increased circuit loss, and a lowering of resonator Q value. This is probably because the internal conductor used in the resonator can be porous or frit can be left in the internal conductor, resulting in an increased high-frequency resistance.

A variety of measures have been contemplated for reducing the high-frequency resistance of the internal conductor, reducing the loss of a transmission line, and improving the Q value of a resonator and other properties. Exemplary approaches are by using a low resistivity metal such as pure silver powder as the conductor powder of the conductor paste; mixing flake silver particles and minimizing the amount of glass frit or similar additive, thereby increasing the contact area between metal particles; and using a thermally decomposable material such as carbon paste instead of the conductor paste, thereby allowing voids to be formed due to thermal decomposition during-firing, and forcing molten silver into the voids under pressure. These approaches, however, are not successful in fully reducing the high-frequency resistance, reducing the loss of a transmission line, or increasing the Q value of a resonator and are extremely low in productivity, thus failing to achieve the intended purposes. A lowering of conductivity due to imperfectness of the internal conductor and a lowering of Q value and other properties such as capacitor, inductor and transmission line functions form a problem common to multilayer ceramic parts such as multilayer ceramic substrates independent of their structure, intended use and preparation process. There is a desire to overcome this problem.

OBJECT OF THE INVENTION

An object of the present invention is to provide a multilayer ceramic part such as a multilayer ceramic substrate and the like in which the internal conductor is densified, a circuit loss is minimized and various circuit properties including resonator Q value are improved as well as a method for preparing the same.

This and other objects are achieved by the present invention which is defined below as (1) to (24).

(1) A method for preparing a multilayer ceramic part by forming a pattern of internal conductor on an insulating ceramic material layer and stacking another insulating ceramic material layer thereon, followed by firing, wherein said firing is at or above the melting point of said internal conductor.

(2) A method for preparing a multilayer ceramic part according to (1) wherein said pattern of internal conductor is formed by printing a conductor paste containing conductor powder and fired concurrent with said ceramic material layers.

(3) A method for preparing a multilayer ceramic part according to (2) wherein said conductor powder contains at least 90% by weight of silver or copper.

(4) A method for preparing a multilayer ceramic part according to (2) wherein said conductor paste contains up to 30% by volume of glass frit based on said conductor powder or is free of glass frit.

(5) A method for preparing a multilayer ceramic part according to (2) wherein said firing is carried out at a temperature between the melting point of said conductor powder and said melting point +300° C.

(6) A method for preparing a multilayer ceramic part according to (2) wherein prior to the firing, said pattern of internal conductor is sealed within said ceramic material layers, and after the firing, the fired body is cut.

(7) A method for preparing a multilayer ceramic part according to (2) wherein when the internal conductor layer exposed by cutting and etching on an end face is observed under a scanning electron microscope, substantially no grain boundaries between conductor grains are found in the internal conductor layer resulting from firing of said paste.

(8) A method for preparing a multilayer ceramic part according to (7) wherein said conductor paste is free of glass frit and a continuous layer of internal conductor is formed in said internal conductor layer.

(9) A method for preparing a multilayer ceramic part according to (7) wherein said conductor paste contains glass frit, a continuous layer of internal conductor is formed in said internal conductor layer, and said glass frit is excreted outside the continuous layer.

(10) A method for preparing a multilayer ceramic part according to (1) wherein said internal conductor includes at least two conductors having different melting points, and said firing is carried out at a temperature between the melting point of a low melting internal conductor and below the melting point of a high melting internal conductor of said internal conductor.

(11) A method for preparing a multilayer ceramic part according to (10) wherein said patterns of high and low melting internal conductors are formed by printing conductor pastes containing high and low melting point conductor powders, respectively, and fired concurrent with said ceramic material layers.

(12) A method for preparing a multilayer ceramic part according to (11) wherein said low melting conductor powder contains at least 90% by weight of silver.

(13) A method for preparing a multilayer ceramic part according to (10) wherein a plurality of ceramic material layers are formed with a plurality of high melting internal conductor layers, respectively, and the ceramic material layer disposed between the low melting internal conductor pattern and another internal conductor pattern adjacent thereto has a greater thickness than said ceramic material layer disposed between the patterns of the high melting internal conductor.

(14) A method for preparing a multilayer ceramic part according to (10) wherein an internal conductor for leading a pattern of said low melting internal conductor to a surface portion is a high melting internal conductor.

(15) A multilayer ceramic part comprising a fired ceramic body and an internal conductor layer formed within the ceramic body by concurrent firing, wherein when the internal conductor layer exposed by cutting and etching on an end face is observed under a scanning electron microscope, substantially no grain boundaries between conductor grains are found in said internal conductor layer.

(16) A multilayer ceramic part according to (15) wherein said concurrent firing is done at a temperature equal to or above the melting point of the internal conductor of said internal conductor layer.

(17) A multilayer ceramic part according to (15) wherein a continuous layer of internal conductor is formed in said internal conductor layer.

(18) A multilayer ceramic part according to (15) wherein a continuous layer of internal conductor is formed in said internal conductor layer, and glass frit which has been added to an internal conductor paste for forming said internal conductor layer is excreted outside the continuous layer.

(19) A multilayer ceramic part according to (15) wherein said internal conductor layer includes at least two internal conductor layers having different melting points, and when a low melting internal conductor layer of said internal conductor layer exposed by cutting and etching on an end face is observed under a scanning electron microscope, substantially no grain boundaries between conductor grains are found in said low melting internal conductor layer.

(20) A multilayer ceramic part according to (19) wherein said concurrent firing is done at a temperature between the melting point of the low melting internal conductor and below the melting point of the high melting internal conductor.

(21) A multilayer ceramic part according to (19) wherein a continuous layer of internal conductor is formed in said low melting internal conductor layer.

(22) A multilayer ceramic part according to (19) wherein a continuous layer of internal conductor is formed in said low melting internal conductor layer, and glass frit which has been added to an internal conductor paste for forming said internal conductor layer is excreted outside the continuous layer.

(23) A multilayer ceramic part according to (19) which has a plurality of high melting internal conductor layers in said fired ceramic body, and the fired ceramic body disposed between the low melting internal conductor layer and another internal conductor layer adjacent thereto has a greater thickness than the fired ceramic body disposed between the high melting internal conductor layers.

(24) A multilayer ceramic part according to (19) wherein an internal conductor for leading said low melting internal conductor layer to a surface portion is a high melting internal conductor.

ADVANTAGES

In accordance with the present invention, an insulating ceramic body and an internal conductor are co-fired at a temperature which is equal to or above the melting point of the conductor such that the internal conductor is once converted into a molten state and eventually densified to substantially eliminate grain boundaries attributable to conductor particles used from the internal conductor, thereby reducing a transmission line loss and improving operating properties such as resonator Q value. Then by forming a tri-plate line configuration using the internal conductor, incorporating the configuration in the interior of the substrate, and providing necessary interconnections, there is obtained a multilayer ceramic part such as a compact multilayer ceramic substrate having built therein a resonator with a high Q value.

Nevertheless, if the internal conductor is melted upon co-firing, diffusion of silver or the like into a ceramic body can take place to change physical properties or degrade operating properties. In an embodiment where a tri-plate line configuration is incorporated, since a center resonating conductor is sandwiched between thick ceramic bodies, diffusion of silver or the like gives rise to little problem and melting ensures the advantages of a reduced loss and increased Q value. However, diffusion of silver or the like can degrade the properties of internal interconnection layers which are separated by a thin ceramic body. This can make it difficult to reduce the thickness or size of a multilayer ceramic part.

Then in such a situation, internal conductors having different melting points are used and the insulating body and the internal conductor are co-fired at a temperature between the melting point of a low melting point internal conductor and below the melting point of a high melting point internal conductor whereby the low melting internal conductor is densified by once melting it and thereby substantially extinguishing grain boundaries associated with conductor particles, thus reducing the loss of a transmission line associated therewith and improving Q value or the like. Those internal conductors which can lose their properties due to diffusion of silver or the like, for example, internal interconnection layers are formed of a high melting internal conductor to prevent such properties degradation. As a result, the spacing between layers of the high melting internal conductor can be reduced. Then by forming a tri-plate line configuration using these two internal conductors, incorporating the configuration in the interior of the substrate, and providing necessary interconnections, there is obtained a multilayer ceramic part such as a compact multilayer ceramic substrate having built therein a resonator with a high Q value and free from property degradation.

In melting the internal conductor, there is a possibility that the internal conductor evaporate or bleed off under some conditions. This can be effectively prevented by forming a lead section for leading the internal conductor to a surface portion from a high melting internal conductor.

BRIEF DESCRIPTION OF THE DRAWINGS

FIGS. 9 to 12 are SEM photomicrographs of etched sections of comparative multilayer ceramic parts.

FIG. 15 is a set of photos of the element distribution pattern by EPMA (electron probe microanalyzer) showing the diffusion state of atoms, especially silver element in a substrate.

FIG. 17 is a perspective view showing another exemplary resonator-built-in substrate.

FIG. 18 is a partial perspective view of FIG. 17.

FIG. 23 is a perspective view showing a yet further exemplary resonator-built-in substrate.

DETAILED DESCRIPTION OF THE INVENTION

Figure 1:
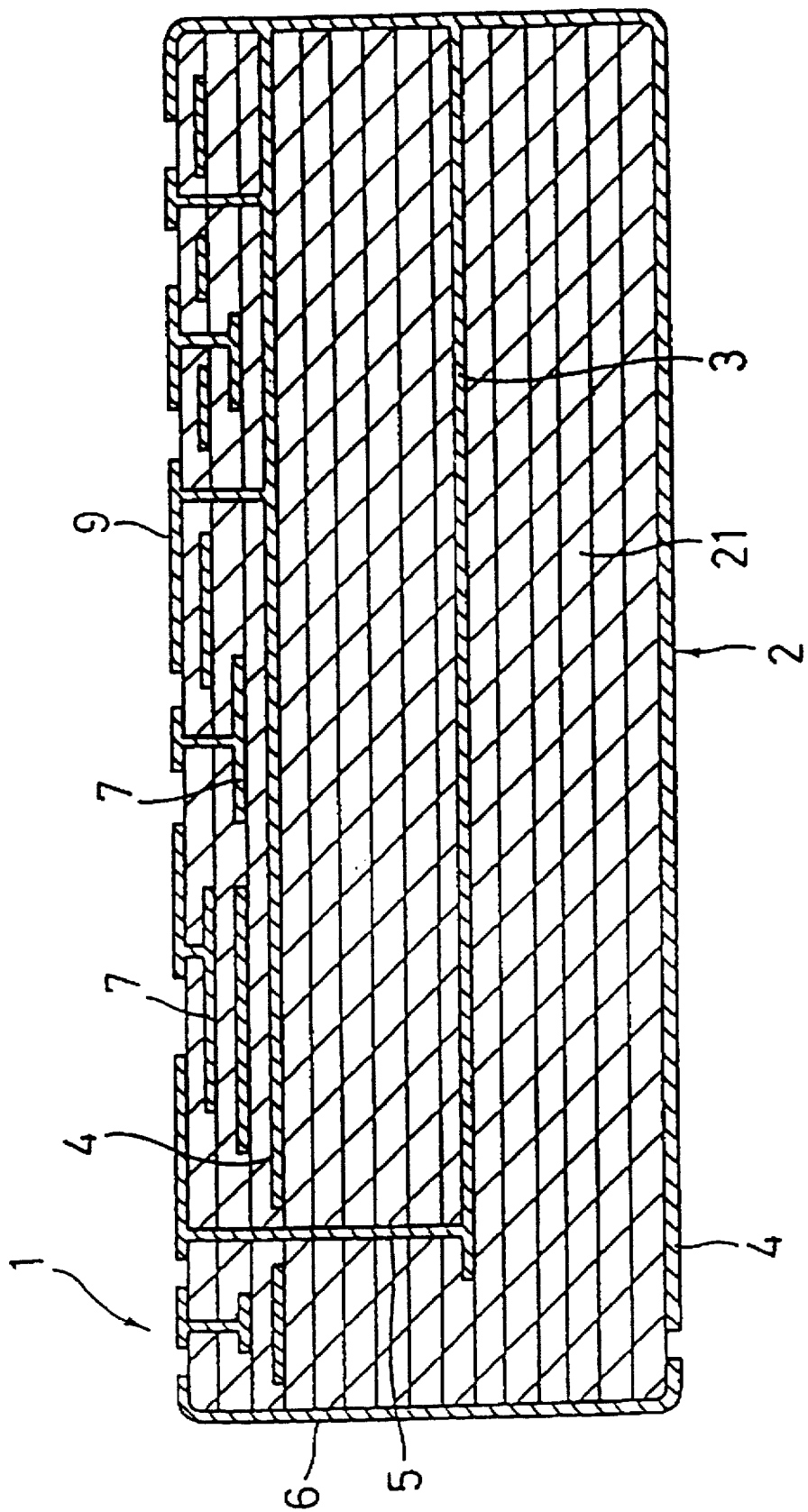
FIG. 1 is a cross-sectional view of one example of the multilayer ceramic part of the invention embodied as a resonator-built-in substrate.

The illustrative construction of the present invention is described in detail.

The multilayer ceramic parts of the invention include, for example, a resonator adapted for use in a quasi-microwave region of about 1 to 3 GHz. More particularly, a multilayer ceramic part as typified by a resonator is prepared by forming patterns of internal conductor on green sheets of dielectric material, stacking the green sheets, and compression bonding the sheets in a hot press, followed by firing. In addition to this process known as a green sheet process, the part may be prepared by another process of alternately stacking a paste of dielectric material and a paste of internal conductor which is known as a multilayer printing process.

In accordance with the present invention, an internal conductor to be described later and ceramic material layers such as green sheets of insulating material such as dielectric material are concurrently fired at a temperature at or above the melting point of the internal conductor. This causes the internal conductor to be melted, resulting in a densified structure, improved contact of the conductor, a reduced line loss, and an improved Q value of the resonator.

In particular, the internal conductor is preferably of silver having a low resistivity. In the case of silver having a melting point of 960° C., firing is preferably carried out at a temperature of at least 960° C., more preferably at 960° to 1260° C., most preferably 970° to 1100° C. If desired, copper having a melting point of 1060° C. may be used and in this case, firing is preferably carried out at a temperature of at least 1060° C., more preferably at 1060° to 1360° C., most preferably 1070° to 1200° C. The benefits of the invention are obtained by firing the internal conductor at a temperature between the melting point and the melting point +300° C., more preferably between the melting point +10° C. and the melting point +140° C., concurrent with the ceramic material layers such as green sheets. This is because none of the benefits of the invention are obtained with a firing temperature below the melting point whereas too high firing temperatures promote diffusion of silver or copper into the dielectric material, resulting in poor properties. Firing is generally carried out in air for about 1 minute to about 1 hour, preferably about 5 to 20 minutes in the case of silver. In the case of copper, firing is generally carried out at a controlled oxygen partial pressure ($P_{O_2}$) of up to $10^{-6}$ atm. It is to be noted that firing may be repeated several times, with at least one firing step being at or above the melting point.

In the practice of the invention, the conductor serving as the internal conductor is preferably silver having a melting point of approximately 960° C. or copper having a melting point of approximately 1060° C. It is then preferred to use metal materials having a silver or copper content of at least 90% by weight, more preferably pure silver or copper having a purity of at least 99% by weight, especially at least 99.9% by weight. Use of such pure silver or pure copper can minimize the resistivity and loss, leading to an improved Q value of a resonator. The internal conductors which are to be fired at or above their melting point for reducing the resistivity and loss thereof and increasing the conductivity thereof are referred to as low melting internal conductors, hereinafter.

Although the internal conductor may consist solely of such a low melting internal conductor, a low melting internal conductor may be combined with a high melting internal conductor in a preferred embodiment. The conductor used as the high melting internal conductor may be a conductor which has a higher melting point than the conductor used as the low melting internal conductor. It is to be noted that since firing is carried out at a temperature intermediate the melting points of the low and high melting internal conductors, the conductor used has the high melting internal conductor should preferably have a melting point which is at least 30° C., more preferably 50° to 200° C., most preferably 50° to 100° C. higher than the melting point of the low melting internal conductor in order that both the conductors be effectively fired. It is possible to use a mixture of two metal powders such as Ag and Pd powders as the high melting internal conductor as will be described later, the mixture being alloyed upon firing without melting Ag. In such a case, the melting point is that of the alloy.

The preferred conductor used as the high melting internal conductor is an Ag-Pd alloy containing up to 30% by weight, especially 5 to 10% by weight of Pd where silver is used as the low melting internal conductor. Instead of the alloy, a mixture of Ag and Pd powders may also be used. As long as Ag and Pd powders are uniformly dispersed, firing initially induces alloying between Ag and Pd while the silver is not melted. Additionally, for silver, there may be used Ag-Au alloys containing up to 100% by weight, especially 50 to 60% by weight of Au; Ag-Pt alloys containing up to 20% by weight, especially 5 to 10% by weight of Pt; Au-Pd alloys containing up to 20% by weight, especially 5 to 20% by weight of Pd; Au-Pt alloys containing up to 10% by weight, especially 5 to 10% by weight of Pt; gold; copper; Au-Cu alloys containing up to 25% by weight of Au; Au-Cu alloys containing up to 20% by weight of Cu; Cu-Pt alloys containing up to 10% by weight, especially up to 5% by weight of Pt; Cu-Ni alloys containing up to 25% by weight, especially up to 10% by weight of Ni, etc. Where copper is used as the low melting internal conductor, there may be used Ag-Pt alloys containing 7 to 30% by weight, especially 10 to 20% by weight of Pt; Au-Pd alloys containing 2 to 20% by weight, especially 2 to 10% by weight of Pd; Au-Pt alloys containing 2 to 20% by weight, especially 2 to 10% by weight of Pt; Cu-Pt alloys containing up to 30% by weight, especially 15 to 20% by weight of Pt; Cu-Ni alloys containing up to 40% by weight, especially 20 to 30% by weight of Ni, etc.

It is to be noted that two or more high melting internal conductors may be used and in some cases, two or more low melting internal conductors may be used. Further, a component of the high melting internal conductor may be partially melted. Note that substantially all of the low melting internal conductor should be melted.

An internal conductor pattern may be formed by interposing a silver foil of a predetermined shape between green sheets of dielectric material or by printing or transferring a conductor paste to green sheets, with the printing process being especially preferred.

Where a pattern is formed from a conductor paste, the silver powder or copper powder or other conductor powders for the low and high melting internal conductors should preferably have a mean particle size (major axis diameter in the case of anisotropic particles) of 0.5 to 20 μm, more preferably 1 to 5 μm. Particles with a too small particle size would be difficult to disperse so that the content of conductor powder in a conductor paste cannot be increased or if could, the resulting conductor paste might become too viscous to form a closely defined pattern. On the other hand, a too large particle size would make it difficult to form a pattern by screen printing and transferring techniques. The shape of silver particles is not limited although spherical particles are generally used, which may be partially or entirely replaced by flake particles.

The paste for the low melting internal conductor preferably contains 60 to 95% by weight, more preferably 70 to 90% by weight of conductor powder. A lower content would lead to a lowering of resistivity, Q value or the like, partial breakage of the pattern after firing, and a variation of resistivity, Q value or the like. A higher content would provide a paste with a too high viscosity to form a pattern.

The low melting internal conductor which is melted during firing can locally collect within the substrate to form a network structure under certain firing conditions, resulting in a variation of Q value. This phenomenon is, however, prevented by adding to the internal conductor paste a glass frit having a softening point near the melting point of the conductor powder. The addition of glass frit is also effective for preventing diffusion of the internal conductor material. However, if a problem of diffusion or the like is not of concern, it is rather preferred to omit glass frit. Then the transmission line loss is further reduced.

The glass frit which can be contained in the low melting internal conductor paste is preferably a glass having a softening point near the melting point of conductor powder such as silver, especially from 700° to 1100° C. More particularly, a glass having a softening point of 700° to 1000° C., especially 900° to 980° C. may be used for silver powder and a glass having a softening point of 800° to 1100° C., especially 1000° to 1080° C. may be used for copper powder. Addition of such glass frit minimizes the development of a network structure after melting and suppresses of Q value variation.

Although the composition of the glass frit used herein is not particularly limited, the following composition is preferred.

$SiO_2$: 55–75 mol %, especially 65–70 mol %
$Al_2O_3$: 10–30 mol %, especially 15–20 mol %
Alkaline earth metal oxide(s): 10–20 mol %, especially 5–15 mol %
$ZrO_2$: 0–5 mol %

Preferred among the alkaline earth metal oxides are one or more of SrO, CaO and MgO. Although the mean particle size of glass frit is not particularly limited, particles of about 0.5 to 2.0 μm in size are generally used.

Where glass frit is added to the low melting internal conductor paste, its content is preferably up to 10% by weight, more preferably 1 to 10% by weight, most preferably 3 to 8% by weight. Differently stated, the glass frit is preferably contained in an amount of up to 10% by weight, more preferably 2 to 10% by weight, most preferably 4 to 6% by weight, and in an amount of up to 30% by volume, more preferably 2 to 30% by volume, most preferably 5 to 10% by volume, both based on the conductor powder. As previously described, although a smaller content of glass frit would be less effective for preventing a network structure and thus invite Q value variation, it is rather preferred to reduce the glass frit content to zero if a problem of silver diffusion is out of concern or copper is used. It is to be noted that a too large amount of glass frit can result in an increased resistivity and a reduced Q value.

More particularly, silver powder used in the conductor paste is generally a fine powder having a mean particle size of up to about 1 μm so that upon concurrent firing, silver can diffuse into the dielectric material and shrinkage occurs in those areas associated with a higher rate of diffusion more quickly than in other areas, causing cracks. An approach addressing this problem is to add glass frit to the paste to prevent silver diffusion and crack occurrence therewith. However, where relatively coarse silver powder having a mean particle size of at least about 5 μm is used or appropriate firing conditions are selected in order to increase the metal component content of conductor paste, silver diffusion takes place to a less extent so that a fritless system can be sintered without cracking.

On the other hand, the paste for the high melting internal conductor preferably contains 60 to 95% by weight, more preferably 70 to 90% by weight of conductor powder. A lower content would lead to a lowering of resistivity, partial breakage of the pattern after firing, and a variation of resistivity. A higher content would provide a paste with a too high viscosity to form a pattern.

Glass frit may be contained in the high melting internal conductor paste. The glass frit used is preferably a glass having a softening point near the melting point of conductor powder, more preferably from 700° to 1100° C., especially from 700° to 1000° C. Addition of such glass frit prevents conductor diffusion and thus allows for firing without cracking or delamination. It is to be noted that in the case of Ag-Pd, a fritless system can be fired without cracking by controlling the amount of Pd added so as to suppress silver diffusion.

Although the composition of the glass frit used herein is not particularly limited, the following composition is preferred.

$SiO_2$: 55–75 mol %
$Al_2O_3$: 10–30 mol %
Alkaline earth metal oxide(s): 10–20 mol %
$ZrO_2$: 0–5 mol %

Preferred among the alkaline earth metal oxides are one or more of SrO, CaO and MgO. Although the mean particle size of glass frit is not particularly limited, particles of about 0.5 to 2.0 μm in size are generally used.

Where glass frit is added to the high melting internal conductor paste, its content is preferably up to 10% by weight, more preferably 1 to 10% by weight. Differently stated, the glass frit is preferably contained in an amount of up to 10% by weight, more preferably 2 to 10% by weight based on the conductor powder. A smaller content of glass frit would allow cracking and delamination to occur. For minimized losses, it is rather preferred to reduce the glass frit content to zero. It is to be noted that a too large amount of glass frit can result in an increased resistivity.

These internal conductor pastes may contain a vehicle in addition to the conductor powder such as silver powder and glass frit. Exemplary vehicles include binders such as ethylcellulose, polyvinyl butyral, methacrylic resin, and butyl methacrylate, solvents such as terpineol, butylcarbitol, butylcarbitol acetate, toluene, alcohol, and xylene, other various dispersants, activating agents, plasticizers and the like. Any of these vehicles may be properly selected in accordance with a particular purpose. The amount of vehicle added is preferably about 10 to 20% by weight of the paste.

These two or more types of internal conductor paste are preferably applied as a coating such that the coating after firing may have a thickness of about 10 to 60 μm, especially about 20 to 50 μm. Coating formation may be by well-known screen printing and transfer techniques.

Ceramic material layers of insulating dielectric material on which patterns of the internal conductor paste are formed generally contain glass and oxide aggregates. Examples of the oxide aggregate include $Al_2O_3$, quartz, mullite, cordierite, $R_2Ti_2O_7$ (R is at least one of lanthanides), $Ca_2Nb_2O_7$, $MgTiO_3$, $SrZrO_3$, $TiO_2$, $SnO_2 \cdot TiO_2$, $ZrTiO_4$, $Ba_2Ti_9O_{20}$, $Sr_2Nb_2O_7$, $CaTiO_3$, $SrTiO_3$, $SrSnO_3$, $BaO \cdot R_2O_3 \cdot nTiO_2$ (R is a lanthanide) alone and mixtures thereof. The oxide aggregate used herein may have a composition somewhat deviating from its stoichiometry, and a mixture of stoichiometric and deviated compositions and a mixture of deviated compositions are also acceptable. Various oxides such as $Bi_2O_3$, MnO and CuO may be added to the oxide aggregate.

The ceramic material layers may be green sheets or layers formed by screen printing and other techniques. It is to be noted that the ceramic material layers are preferably densified, especially to 95% or higher of the theoretical density at a temperature immediately below the melting point of the conductor powder in the low melting internal conductor paste, preferably between the melting point −200° C. and the melting point, especially between the melting point −100° C. and the melting point. Thus, the ceramic material layers may be formed of either composite materials of oxide aggregates as mentioned above and glass, or ceramic materials free of glass, for example, various dielectric green sheet-forming materials having a firing temperature of, say, about 800° to 1000° C., for employment in chip capacitors and dielectric resonators.

Where a glass composite material is used, a ceramic material layer such as a green sheet contains oxide aggregate in an amount of 20 to 96% by volume, especially 25 to 95% by volume based on the total of the oxide aggregate and glass. Too high contents of the oxide aggregate would aggravate sinterability. Too low contents would provide dielectric substrates with low deflective strength. The oxide aggregate preferably have a mean particle size of about 0.5 to 3 μm. A too small particle size would render sheet formation difficult whereas a too large particle size would give a fired ceramic body lacking strength.

The glass frit is preferably a glass having a softening point of about 700° to 900° C. where the conductor powder used is silver powder and a glass having a softening point of about 800° to 1000° C. where the conductor powder used is copper powder. A too high softening point would render difficult firing at optimum temperature whereas a too low softening point would render difficult binder removal during sheet formation, leaving a problem of insulation.

The composition of the glass frit used herein is not particularly limited although the following composition is preferred because green sheets of high strength are obtained at firing temperature in the above-defined range and diffusion of the internal conductor is suppressed.

$SiO_2$: 50–70 mol %
$Al_2O_3$: 5–20 mol %
Alkaline earth metal oxide(s): 25–45 mol %
$B_2O_3$: 0–10 mol %

Preferred among the alkaline earth metal oxides are one or more of SrO, CaO and MgO. Preferably these three elements are used together, whereupon the content of SrO is preferably 15 to 30 mol %, the content of CaO is 1 to 8 mol % and the content of MgO is 1 to 7 mol %.

Although the mean particle size of glass is not particularly limited, particles of about 1 to 3 μm in size are generally used in view of formability or the like. Green sheets preferably contain 4 to 80% by volume of glass. Too low contents would aggravate sinterability whereas too high contents would provide dielectric substrates with low deflective strength.

Prior to sintering, the ceramic layer-forming dielectric material is combined with a vehicle to form a slurry. Exemplary vehicles include binders such as ethylcellulose, polyvinyl butyral, methacrylic resin, and butyl methacrylate, solvents such as terpineol, butylcarbitol, butylcarbitol acetate, acetate, toluene, alcohol, and xylene, other various dispersants, activating agents, plasticizers and the like. Any of these vehicles may be properly selected in accordance with a particular purpose. The amount of vehicle added is preferably about 65 to 85% by weight per 100 parts by weight of the oxide aggregate and glass combined. The ceramic layer-forming material is formed into green sheets or if desired, print laminated.

Next, an embodiment wherein a multilayer ceramic substrate embodying the multilayer ceramic part of the present invention forms a resonator is described in conjunction with the preferred embodiment shown in FIG. 1. The resonator shown in FIG. 1 is a multilayer ceramic substrate having a tri-plate line which forms a voltage controlled oscillator (VCO). The multilayer ceramic substrate includes a laminate 2 having a plurality of integrally stacked dielectric layers 21 and a center conductor 3 in the form of a strip line between dielectric layers 21 at the middle of the laminate 2. The shape, dimensions and number of the strip line are not particularly limited and may be determined in accordance with a particular purpose.

Internal lines 7 are formed between dielectric layers 21. The internal lines 7 may be configured to a desired pattern in accordance with their purpose and application, for example, coil conductors and capacitor electrodes as well as signal lines. Further ground planes 4 are formed between dielectric layers 21 and on one surface of the dielectric layer 21 laminate. The center conductor 3 in the form of a strip line is disposed between the ground planes 4, 4 to form a tri-plate line while a resonator is formed between the ground planes 4, 4. On the laminate 2 are formed an external conductor 6 and a surface electrode 9. The external conductor 6 and surface electrode 9 are electrically interconnected to the strip center conductor 3, ground planes 4 and internal lines 7 through conductors in via holes 5.

Such a resonator is fabricated, for example, by the following procedure. First, an internal conductor paste and an external conductor paste as previously mentioned are separately prepared. The external conductor paste contains a conductor powder, about 0 to 10% by weight of the conductor powder of glass frit and oxide powder, and a vehicle.

Separately, green sheets of dielectric layer-forming material are prepared. Using a slurry of the above-mentioned dielectric material, a predetermined number of green sheets are prepared by a doctor blade technique, for example. Then via holes 5 are formed in the green sheets using a punching machine or mold press. Thereafter, the internal conductor paste is printed on the respective green sheets by a screen printing technique, for example, thereby forming predetermined patterns of internal lines 7, strip line 3, and ground planes 4 and filling via holes 5 with the paste.

The center conductor 3 is formed of a low melting internal conductor which is melted during firing so as to minimize the loss. In order to restrain the influence of silver diffusion, the thickness of dielectric layer 21 between the center conductor and the adjacent internal conductors which are the ground planes 4, 4 in this embodiment is increased. In this embodiment, a multiplicity of dielectric layers 21 are interposed to provide an increased thickness. The spacing between the low melting internal conductor such as the center conductor 3 and other internal conductors is generally about 0.3 to 1.5 mm.

On the other hand, since the internal lines 7 and ground planes 4 do not require such a high degree of conductivity, they may be formed of a high melting internal conductor which does not melt during sintering. Since the high melting internal conductor is not melted and thus little diffusion of the conductor occurs, the spacing between the high melting internal conductors, that is, the thickness of dielectric layer between the high melting internal conductors can be as thin as about 10 to 30 μm. In this way, the necessary minimum thickness can be reduced and yet the performance of the resonator is enhanced, resulting in a very compact, thin, high performance VCO.

It is to be noted that the spacing between layers of the high melting internal conductor such as the internal lines 7, 7 and ground plane 4 is preferably reduced to about $1/100$ to $1/2$ of the spacing between layers of the low melting internal conductor such as center conductor 3 or between layers of the low melting internal conductor and the high melting internal conductor. If a conductor section for leading the low melting internal conductor to a surface portion, such as the conductor filling the via hole 5 is formed of a high melting internal conductor, better results are obtained particularly in the via hole 5 connecting to the low melting internal conductor because volatilization and bleeding of the low melting internal conductor during firing are prevented.

Figure 2:
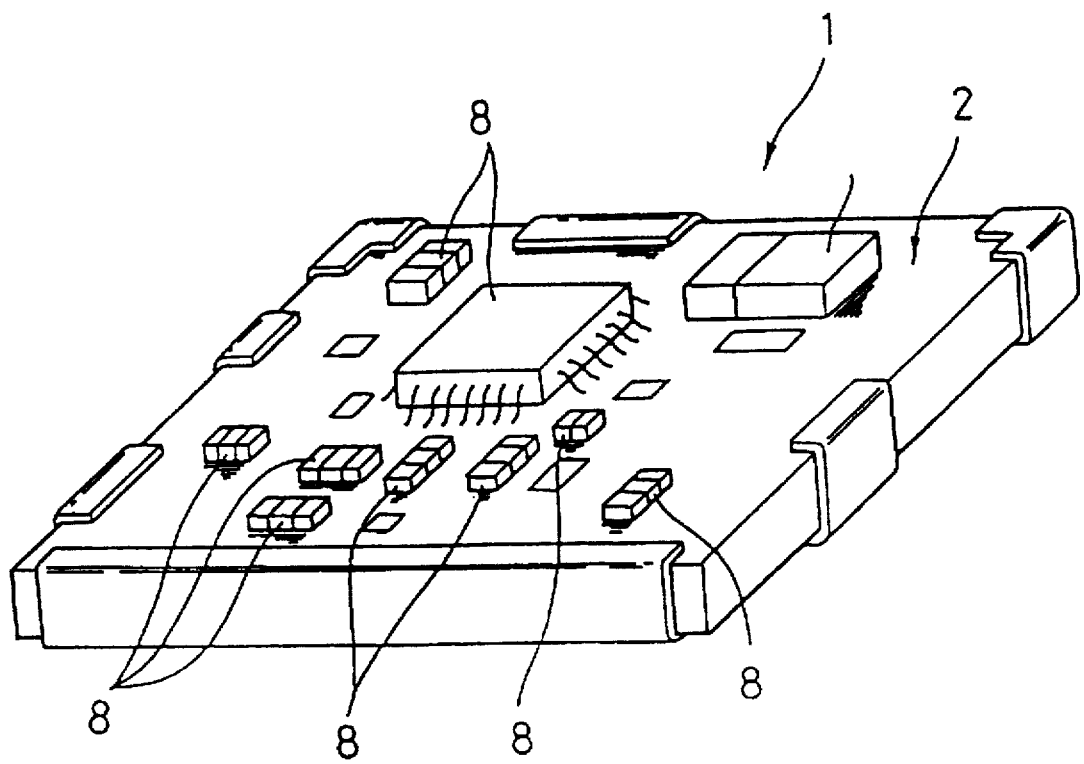
FIG. 2 is a perspective view of a voltage controlled oscillator in which the multilayer ceramic substrate of the invention is used as a resonator.
Figure 3:
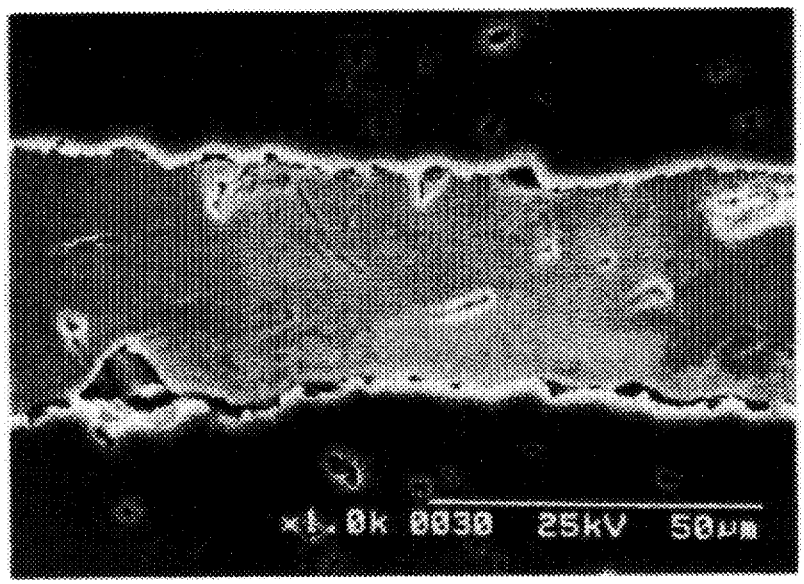
FIGS. 3 to 8 are photomicrographs under a scanning electron microscope (SEM) of etched sections of inventive multilayer ceramic parts.
Figure 4:
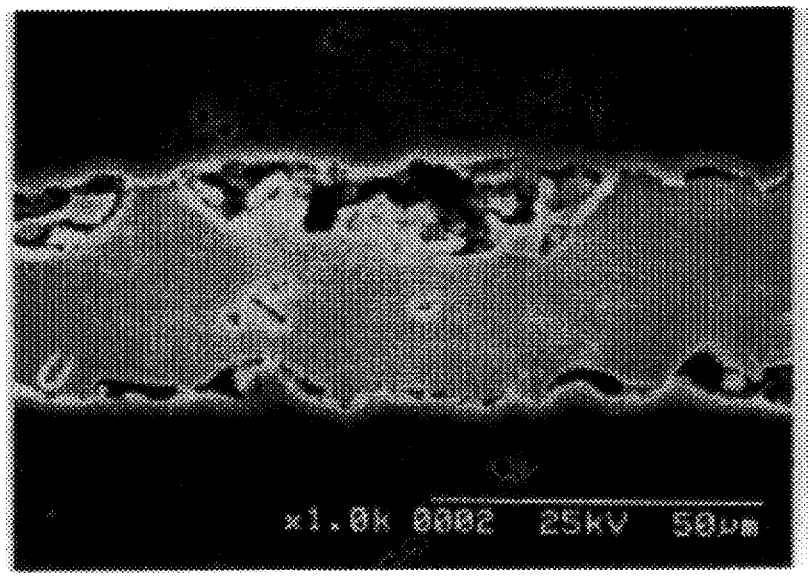
Figure 5:
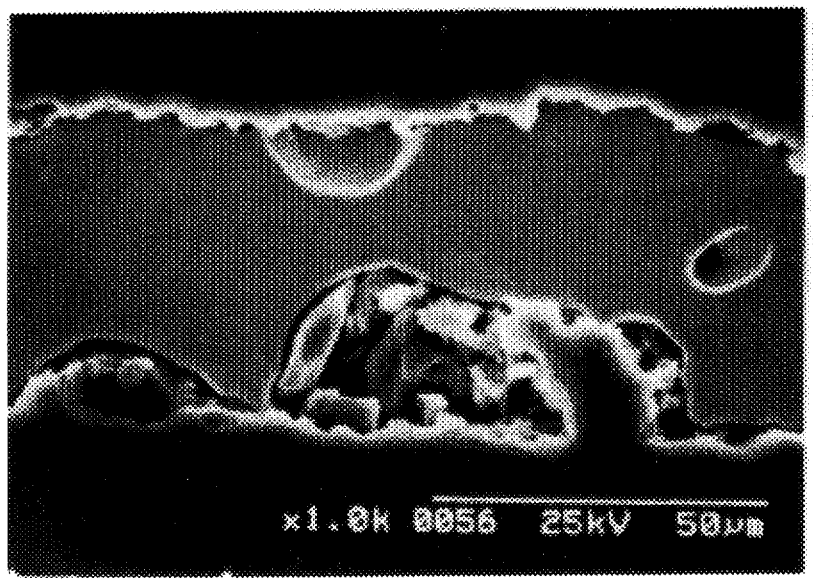
Figure 6:
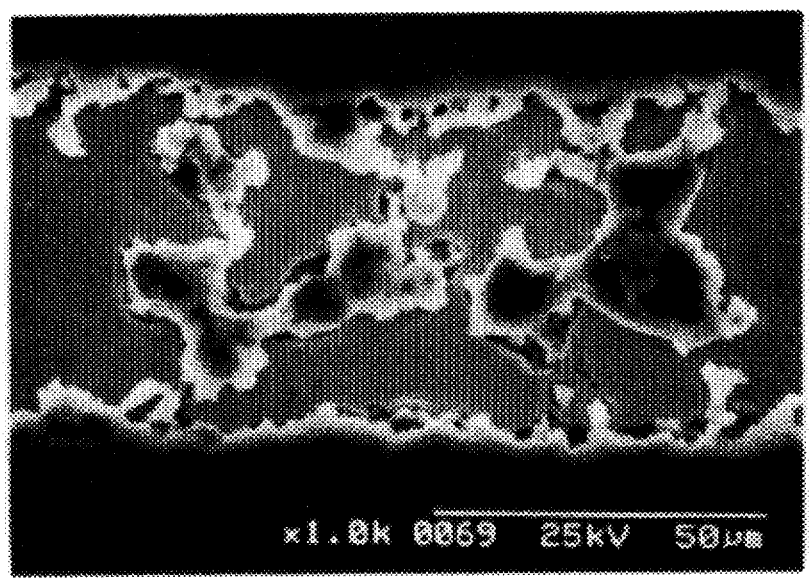
Figure 7:
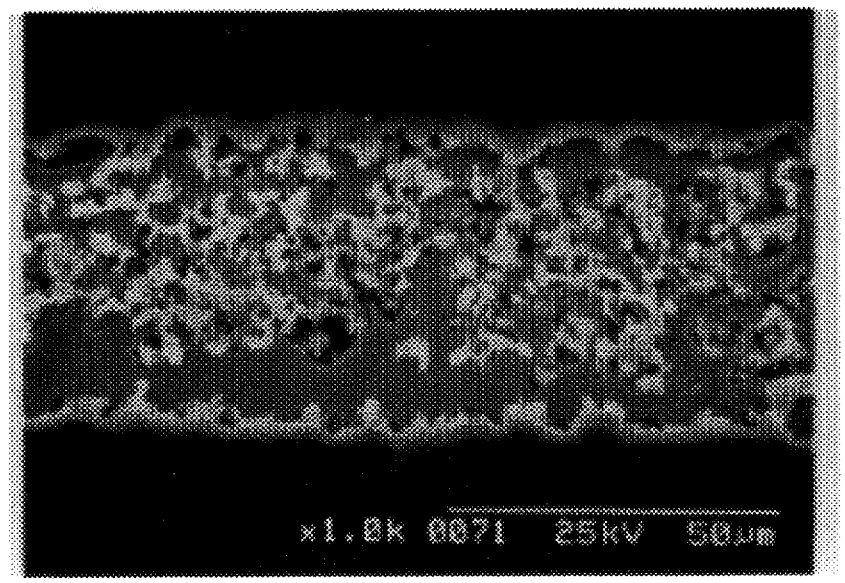
Figure 8:
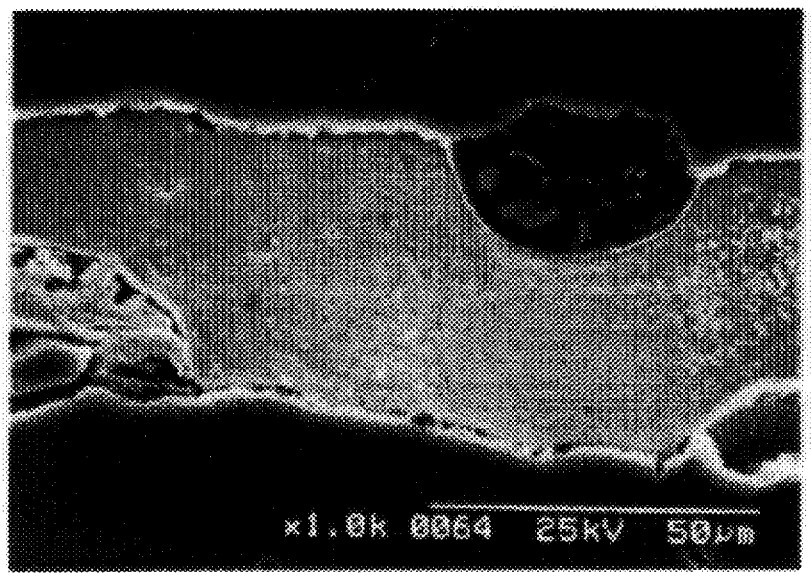

Thereafter, the green sheets are placed one on top of another and pressed into a green sheet laminate using a hot press at about 40° to 120° C. and 50 to 1000 kgf/cm². If desired, binder removal and formation of cutting notches are carried out. The green sheet laminate is then fired for integration at the previously defined temperature usually in air, obtaining a resonator having the strip line 3 between dielectric layers 23 and 25. Then an external conductor paste is printed by a screen printing technique or the like and fired to form an external conductor 6. Preferably, the external conductor 6 is formed by firing concurrent with the dielectric layers 21. Then desired surface mount parts 8 such as varactor diodes and decoupling capacitors are soldered to the external conductor 6 and an insulating cover layer is formed if desired, yielding a voltage controlled oscillator (VCO) 1 as shown in FIG. 2.

In addition to the above-mentioned embodiment, a well-known printing laminate technique of alternately printing and stacking ceramic layers and internal conductor layers may also be used as previously described.

In firing the laminate, it is preferred that the internal conductor is not exposed at the end face of the laminate, that is, the internal conductor is sealed within the green sheets, thereby preventing the conductor which is melted during firing from volatilizing or bleeding. Thereafter, the laminate is cut into chips in which the internal conductor is exposed at the side surface where the external conductor may be connected thereto as illustrated in the figure.

If a conductor section for leading the internal conductor to a surface portion, such as the via hole 5 is formed of a high melting internal conductor, such volatilization or bleeding is prevented. FIG. 17 is a perspective view looking through the interior of such a configuration and FIG. 18 is a perspective view showing the center conductor 3 thereof relative to a viahole conductor 50. This embodiment is a multilayer ceramic substrate for constructing a high frequency circuit such as the above-mentioned VCO (voltage controlled oscillator) by printing a low melting internal conductor material serving as the center conductor 3 on a green sheet S1 of ceramic material, placing thereon a green sheet S2 having formed thereon a pattern of ground plane 40 serving as another internal conductor, placing thereon a green sheet S3 consisting of a single layer or multiple layers for forming a circuit other than the tri-plate oscillator, pressure bonding the sheets in a hot press, firing the assembly, thereafter forming surface circuit patterns including a lower opposed ground plane 45, side electrode E and surface electrode 9 on the bottom, side and top surfaces of the multilayer ceramic substrate by a printing technique, and attaching a surface mount part 8 on the surface circuit pattern at the top. Understandably, the two dielectric layers resulting from the green sheets S1 and S2 and the portion sandwiched between the upper and lower ground planes form the tri-plate oscillator, with its center conductor 3 formed on the green sheet S1. The green sheet S1 may be formed of either a single green sheet or a laminate of plural green sheets.

The green sheet S2 is completed by punching a portion corresponding to the cross section of a viahole conductor 50 (a circular portion in the illustrated embodiment) in a thin green sheet, printing a material for the viahole conductor 50 over an area slightly greater than the circular portion, repeating these steps until a predetermined thickness is reached.

In this regard, on the uppermost layer of the green sheet S2, the ground plane 40 is formed at the same time as the viahole conductor 50 is formed. The green sheet S3 is formed by a similar procedure. The green sheet S3 is fashioned of plural layers, if desired, and formed therein with other viaholes, electrodes and wires as internal conductors for constructing circuits other than the oscillator. It is to be noted that the viahole conductor 50 is also a conductor for electrically connecting the center conductor 3 to the circuit 9 pattern on the surface of a multilayer ceramic substrate.

In this regard, the material for the viahole conductor 50 has a higher melting point than the melting point of the center conductor 3 and the firing temperature is set higher than the melting point of the internal conductor material for the center conductor 3 and lower than the melting point of the viahole conductor 50 material. Then, in firing the multilayer ceramic substrate 1, the viahole conductor 50 which does not melt serves as a plug for preventing a loss of the center conductor 3 from the multilayer ceramic substrate, thus preventing any degradation of electrical properties due to the loss of the center conductor 3 from the multilayer ceramic substrate.

Figure 19:
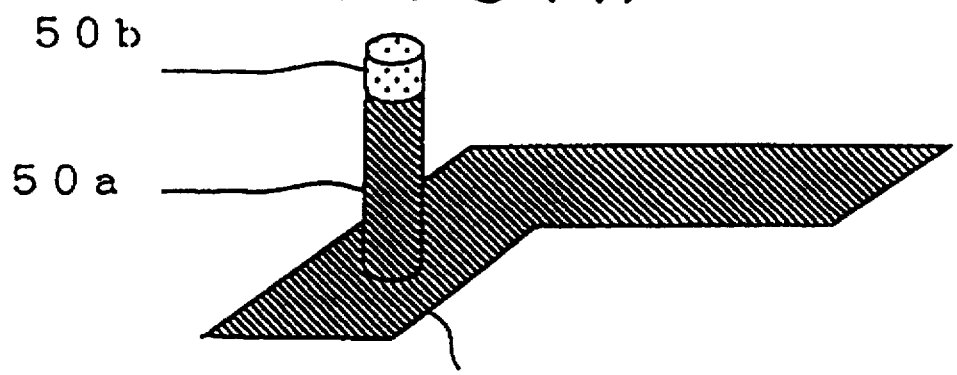
FIGS. 19 and 20 are partial perspective views of further exemplary resonator-built-in substrates.

FIG. 19 shows a viahole which is the same as the previous one except that it includes a viahole body 50a and a surface layer side viahole 50b. The viahole body 50a is formed of the same material as the center conductor 3. The surface layer side viahole 50b forms a surface layer side portion of a viahole conductor material (a portion to be connected to the surface circuit pattern) and has a melting point higher than the melting point of the viahole body 50a.

In this embodiment, firing is made at a temperature higher than the melting point of the viahole body 50a and lower than the melting point of the surface layer side viahole 50b, and then the surface layer side viahole 50b which does not melt during the firing serves as a plug for preventing a loss of the center conductor 3 from the multilayer ceramic substrate, thus preventing any degradation of electrical properties due to the loss of the center conductor 3 from the multilayer ceramic substrate. It will be understood that as compared with the embodiment of FIGS. 17 and 18, the viahole body 50a occupies a major portion of the viahole which has an improved conductivity, resulting in improved electrical properties.

Figure 20:
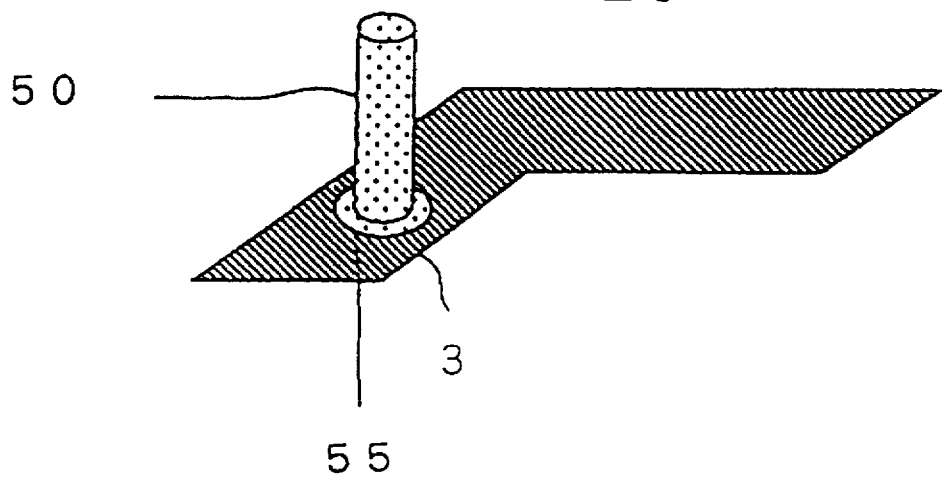

FIG. 20 shows an embodiment wherein a viahole 50 is the same as in the FIG. 18 embodiment, and among the material of the center conductor 3, the viahole 50 is the same as in the FIG. 18 embodiment, among the material of the center conductor 3, an area 55 of the center conductor 3 which is in contact with the viahole conductor 50 is formed of the same material as the viahole 50 so that the contact between the viahole 50 and the contact area 55 has a higher melting point than the center conductor 3 other than the contact area 55. In this embodiment, firing is made at a temperature higher than the melting point of the center conductor 3 other than the contact area 55 and lower than the melting point of the viahole 50, whereby any degradation of electrical properties due to a loss of the center conductor 3 from the multilayer ceramic substrate is prevented. Moreover, this embodiment ensures more stable firing since the bleeding pressure of molten conductor during melting of the center conductor 3 is suppressed.

Figure 21:
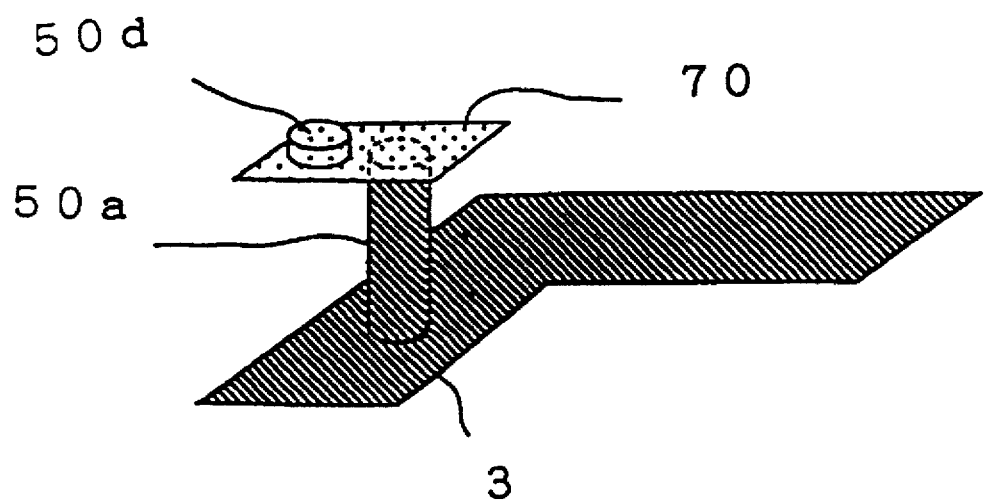
FIG. 21 is a perspective view showing a still further exemplary resonator-built-in substrate.
Figure 22:
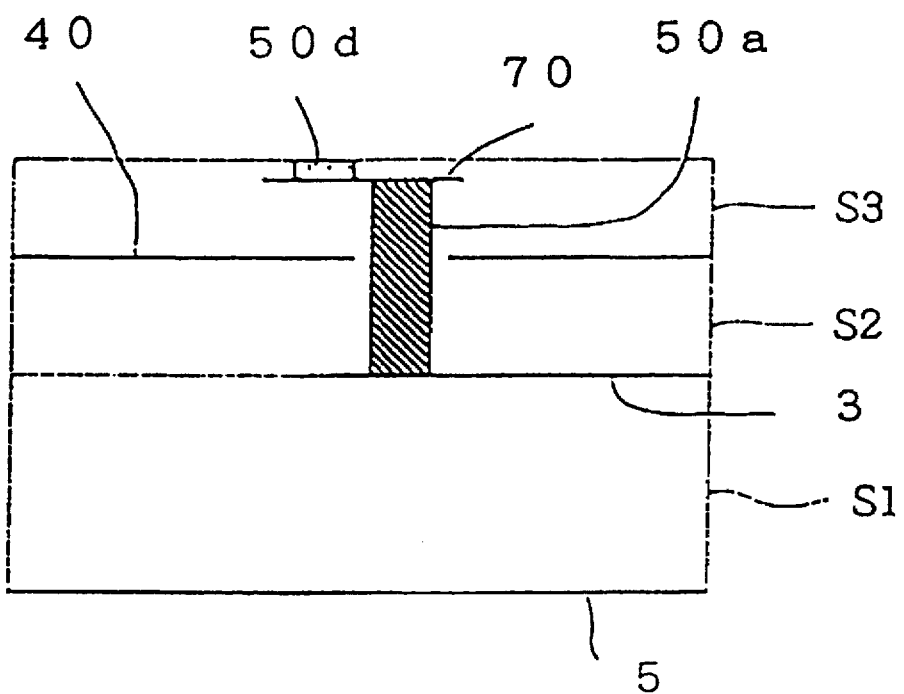
FIG. 22 is a transverse cross section of FIG. 21.

FIGS. 21 and 22 show a further embodiment wherein a viahole conductor includes a surface layer side viahole 50d to be connected to the surface circuit pattern and a viahole body 50a to be connected to the center conductor 3, which are offset via an internal conductor layer 70 (an extension of the viahole body 50a does not intersect with an extension of the surface layer side viahole 50d, and the viahole body 50a is connected to the surface layer side viahole 50d through the internal conductor layer 70). The viahole body 50a is formed of the same material as the center conductor 3, and the surface layer side viahole 50d and the internal conductor layer 70 are formed of the same material as the viahole 50d. In this embodiment, firing is made at a temperature higher than the melting point of the center conductor 3 and lower than the melting point of the surface layer side viahole 50d and internal conductor layer 70, whereby any degradation of electrical properties due to a loss of the center conductor 3 from the multilayer ceramic substrate 1 is prevented. Moreover, this embodiment is more effective in suppressing the bleeding pressure of molten conductor during melting of the center conductor 3 since the bleeding pressure is once countered by the internal conductor layer 70.

FIG. 23 shows an embodiment wherein a lower ground plane 45 is formed on the upper surface of a green sheet S0, that is, formed within this multilayer substrate as another internal electrode of the substrate, the viahole conductor 50 material having a melting point higher than the melting point of the conductor for the opposed ground plane 45 and center conductor 3. In this embodiment, the green sheet S0 is provided beneath the green sheet S1 by printing the opposed ground plane 45 on the green sheet S0 and placing the green sheet S1 thereon. In this embodiment, the opposed ground plane 45 is also improved in conductivity and thus provides a ground potential of higher quality, ensuring further improved oscillator performance.

Figure 24:
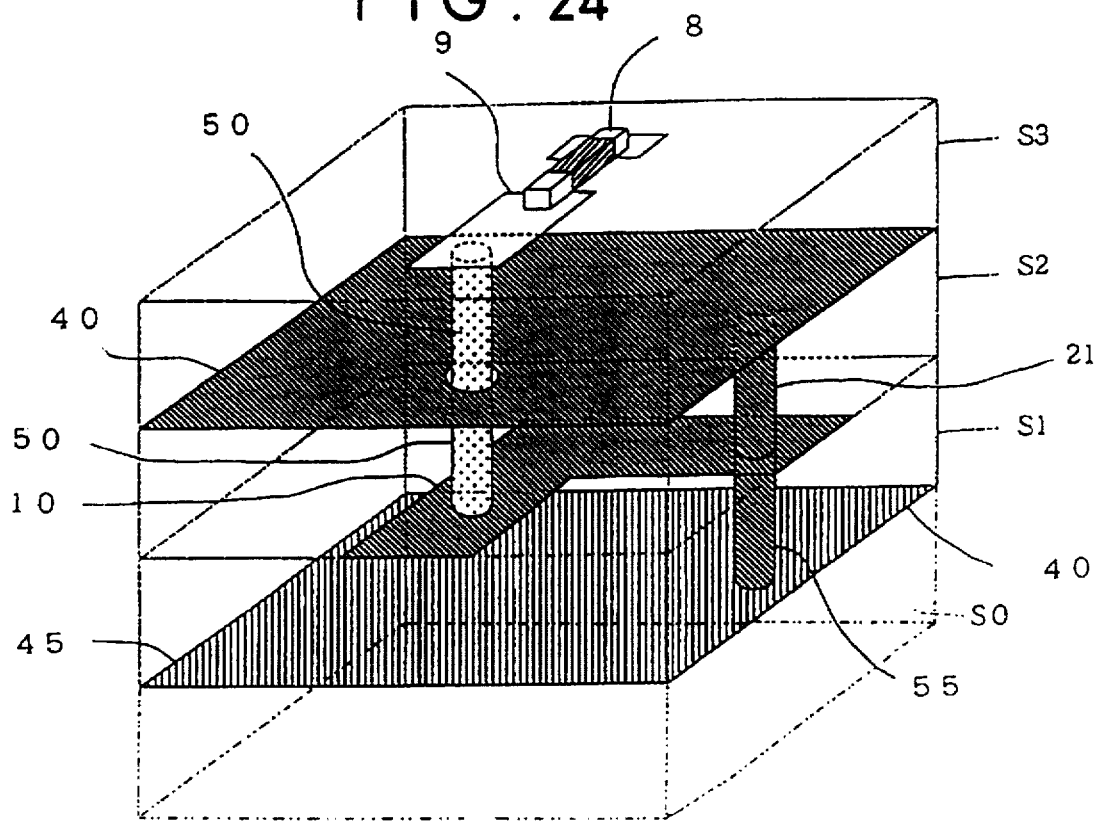
FIG. 24 is a perspective view showing a still further exemplary resonator-built-in substrate.
Figure 25:
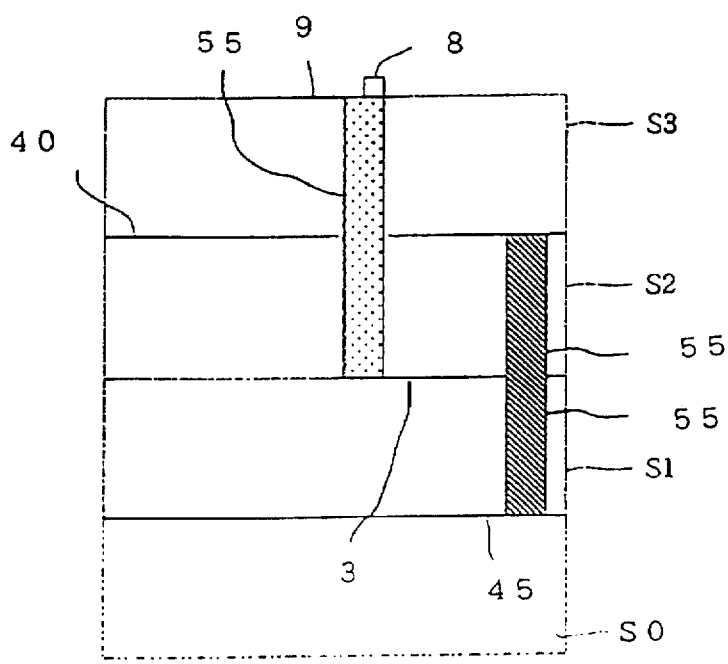
FIG. 25 is a transverse cross section of FIG. 24.

FIGS. 24 and 25 show an embodiment wherein instead of the side electrode E, a second viahole conductor 55 is provided which connects the ground potential side of the center conductor 3, the opposed ground plane 45 and the intermediate ground plane 40, the viahole conductor 50 material having a higher melting point than the second viahole conductor 55 material. In one exemplary embodiment wherein that the upper and lower ground planes 40 and 45 are of 100% silver, this configuration allows the viahole 55, for example, of 100% silver rather than the side electrode E to be used as the electrode for connecting the ground planes 40 and 45, and thus provides a ground potential of higher quality, ensuring further improved oscillator performance.

The low melting internal conductor which has been co-fired in the above-mentioned manner has a dense continuous structure. That is, the conductor layer has a dense structure which is continuous over its entire width and length. More particularly, the internal conductor is once melted such that when the substrate is vertically cut, the internal conductor appearing at the cut end face is etched, and the etched face is observed under a scanning electron microscope (SEM) with a magnifying power of 300 to 3,000, substantially no grain boundaries between conductor grains are found in the dense continuous internal conductor layer. The substantial absence of grain boundaries implies that no grain boundaries are found upon SEM observation over an average area of at least 1,000 $\mu m^2$, especially at least 3,000 $\mu m^2$, moreover at least 5,000 $\mu m^2$, moreover at least 10,000 $\mu m^2$, the complete absence of grain boundaries being possible under optimum conditions. It is also possible that the triple point representing a polycrystalline state is substantially absent, which implies one triple point over at least 1,000 $\mu m^2$, especially at least 3,000 $\mu m^2$, moreover at least 5,000 $\mu m^2$, moreover at least 10,000 $\mu m^2$, the complete absence of the triple point being possible under optimum conditions.

The grain boundaries which can be observed under SEM are boundaries between grains resulting from the once melted raw material conductor powder, but not crystal grain boundaries. Therefore, when the cut end face of the conductor is observed under a transmission electron microscope (TEM) with a magnifying power of about 10,000 to 100,000, fine crystal grain boundaries resulting from the cooling step are found. Observation under SEM and TEM may be made in accordance with a conventional procedure although for etching, a mixture of 50% by volume of conc. ammonia water and 50% by volume of 3% hydrogen peroxide water is used as an etchant and the cut face is filled with resin and mirror finished prior to etching. Etching time is 30 to 120 seconds at room temperature.

As a result of densification, in an SEM image of the internal conductor layer resulting from a low melting internal conductor paste using glass frit, there are observed a continuous layer of the internal conductor and a glass component within the continuous layer or more preferably excreted at the interface between the continuous layer and the fired ceramic body. The glass component is based on the glass frit which has been added to the internal conductor paste and in most cases, it partially collects and excrets at the fired ceramic body-internal conductor layer interface or the like in accordance with the amount added without diffusing into the fired ceramic body. It is to be noted that the high melting internal conductor has grain boundaries corresponding to the conductor particles used or grown during firing as usual.

Among the multilayer ceramic parts of the present invention, the resonator can find utility in various filters having at least a strip line like a TEM line between dielectric layers including high-pass filters, low-pass filters, band-pass filters and band elimination filters as well as branching filters, duplexers, voltage controlled oscillators and similar ones having such filters combined. The multilayer ceramic parts further include various multilayer ceramic substrates for use in a band of about 100 MHz to 3 GHz, multilayer ceramic substrates having a capacitor and/or an inductor built therein, capacitor (C) chips, chip inductors (L), and LC chips.

The present invention can satisfy the Q value required for the resonator incorporated in an integrated circuit based on such a multilayer ceramic substrate which varies with the circuit and should be at least 160 for the above-mentioned voltage controlled oscillator (VCO), for example.

EXAMPLE

Examples of the present invention are given below by way of illustration.

Example 1

Silver powder of at least 99.9% purity (melting point 960° C.), a glass frit and a vehicle were mixed and dispersed in a three-roll mill. The silver powder was spherical having a mean particle size of 3 µm. Three glass frits were used which had the following compositions and a mean particle size of 1.0 µm.

(1) Softening point 960° C.

$SiO_2$: 66.0 mol %

SrO: 15.0 mol %

$Al_2O_3$: 16.0 mol %

$ZrO_2$: 3.0 mol %

(2) Softening point 860° C.

$SiO_2$: 62 mol %

SrO: 26 mol %

$Al_2O_3$: 12 mol %

$ZrO_2$: 0 mol %

(2) Softening point 820° C.

$SiO_2$: 66 mol %

SrO: 26 mol %

$Al_2O_3$: 8 mol %

$ZrO_2$: 0 mol %

An internal conductor paste was obtained by adding a vehicle to the mixture and kneading the mixture in a three-roll mill. The vehicle used included an acrylic resin binder and a terpineol solvent. The mixing proportion of the respective components was:

| | |
|---|---|
| silver powder + glass frit | 90 wt % |
| organic binder | 2.5 wt % |
| organic solvent | 7.5 wt % | while the frit content (% by volume) in the silver powder+ glass frit mix was changed as reported in Table 1.

Separately, a dielectric material was prepared which contained 70% by volume of glass particles having a mean particle size of 1.9 µm, 15% by volume of $Al_2O_3$ particles having a mean particle size of 1.5 µm, and 15% by volume of $TiO_2$ particles having a mean particle size of 1.0 µm. To 100 parts by weight of the dielectric material was added 73 parts by weight of a vehicle. Using a ball mill, the mixture was milled into a slurry. The vehicle used contained an acrylic resin as a binder, ethyl alcohol and toluene as a solvent, and a phthalate ester as a plasticizer. The glass particles had the composition: $SiO_2$ 62 mol %, $Al_2O_3$ 8 mol %, $B_2O_3$ 3 mol %, SrO 20 mol %, CaO 4 mol %, and MgO 3 mol % and a softening point of 815° C.

Using this high-frequency dielectric material paste, green sheets of 0.25 mm thick were prepared by a doctor blade technique. The aforementioned Ag base internal conductor paste was printed on the respective green sheets by a screen printing technique to form a strip line and a ground plane, and the sheets were then stacked in a hot press to form a green sheet laminate. The laminate was degreased and then fired in air for 10 minutes at the temperature shown in Table 1. The internal conductor was 30 µm thick. The internal conductor was sealed within the green sheets.

The laminate was sectioned to a predetermined size, printed with a ground plane-forming Ag paste in accordance with a screen printing technique and then fired in air for 10 minutes at a temperature of 850° C., obtaining a tri-plate line resonator having a resonance frequency of about 1.9 GHz. The size was 10 mm×11.7 mm×2 m. Twelve samples were prepared.

The thus fabricated resonators were measured for Q value, with the results shown in Table 1. Reported are an average of twelve samples and a variation.

TABLE 1

| Sample No. | Glass frit content, vol % (wt %) | Glass frit softening point, °C. | Firing temp. °C. | Qu | Variation of Qu |
|---|---|---|---|---|---|
| 1 | 0 (0) | — | 1000 | 238 | 0.7947 |
| 2 | 5.0 (1.6) | 860 | 1000 | 232 | 1.03 |
| 3 | 10.0 (3.2) | 860 | 1000 | 223 | 1.53 |
| 4 | 17.1 (5.3) | 820 | 1000 | 225 | 1.88 |
| 5 | 16.8 (5.3) | 860 | 1000 | 212 | 2.17 |
| 6 | 17.4 (5.3) | 960 | 1000 | 209 | 2.48 |
| 7 | 16.8 (5.3) | 860 | 1080 | 229 | 3.81 |
| 8 (comparison) | 16.8 (5.3) | 860 | 940 | 144 | 3.01 |
| 9 (comparison) | 16.8 (5.3) | 860 | 900 | 144 | 3.07 |

Next, Qu simulation was carried out under the conditions: line width 2 mm, resonator thickness 2 mm, dielectric material's QF 1000 GHz, line thickness 30 µm, dielectric constant 10.9, and line resistivity $1.62\times10^{-8}$ Ω/m (when the line used was silver in bulk), with the result Qu=281.4. A comparison of the simulation result with the data of Table 1 reveals that a Q value corresponding to 85% of the theoretical value could be obtained through the use of the internal conductor melting method.

Figure 9:
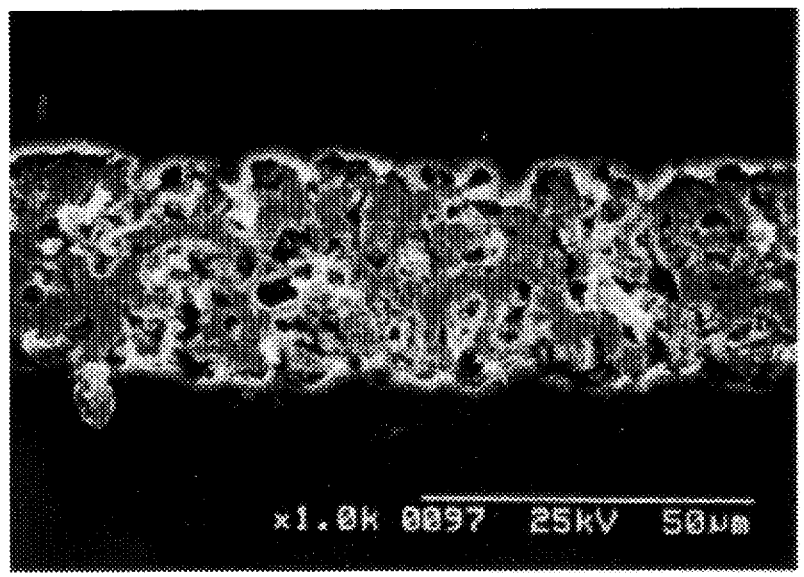
Figure 10:
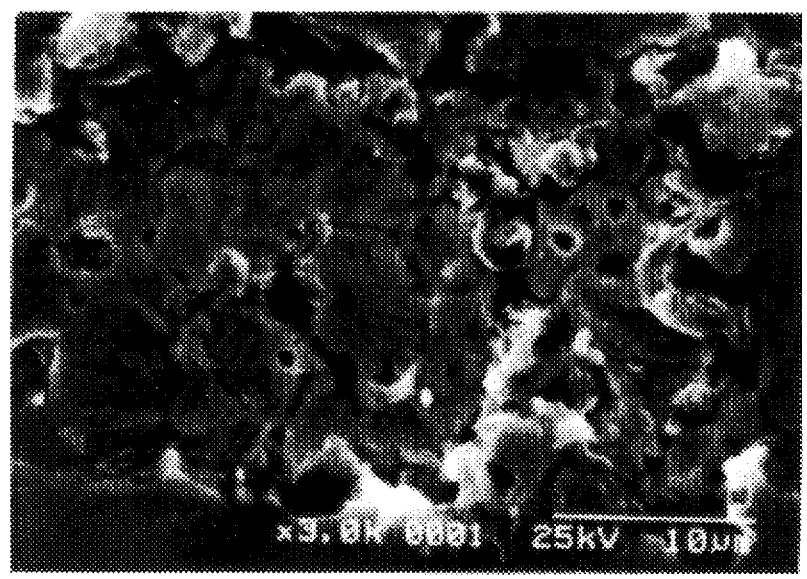

FIGS. 3 to 12 are scanning electron microscope (SEM) photos (×1000 and ×500) in section of the samples. Among them, FIGS. 3, 4, 5, 6, 7 and 8 are photos of sample Nos. 1, 2, 4, 5, 6 and 7 within the scope of the invention, FIGS. 9 and 10 are photos of comparative sample No. 8, and FIGS. 11 and 12 are photos of comparative sample No. 9. It is to be noted that etching was done for 60 seconds under the aforementioned conditions.

It is seen that no silver grain boundaries are present in the internal conductors within the scope of the invention. More specifically, in sample No. 1 using a conductor paste free of frit, no frit is present in the conductor layer. In sample Nos. 2, 4 and 7 having glass frit added, no frit is contained in the conductor layer and the frit was excreted from the conductor layer. In sample Nos. 5 and 6, however, the glass frit was partially excreted and partially collected within the conductor. In either case, the silver in the conductor layer is continuous with no grain boundaries observed. In contrast, in comparative sample Nos. 8 and 9, grain boundaries corresponding to the silver powder used are observed, the glass frit is seen as glaring white in the photos, and the conductor as a whole is porous and does not form a continuous layer, because of which only a low Qu is obtained. It is to be noted that in TEM observation, fine crystal grain boundaries were found.

Example 2

In Example 1, both samples containing 16.8% by volume of glass frit and 0% by volume of glass frit were fired for 10 minutes at 900° C. which is below the melting point or fired for 10 minutes at 1000° C. which is above the melting point, and then fired again for 10 minutes at 1000° C. as shown in Table 2. The results of Qu are shown in Table 2. The effectiveness of firing at or above the melting point is evident from the data of Table 2.

TABLE 2

| Firing conditions | Frit 16.8 vol % | Frit 0 vol % |
| --- | --- | --- |
| 1000° C./10 min. | 212 | 238 |
| 1000° C./10 min. × 2 | 222 | 235 |
| 1000° C./10 min. × 3 | 228 | 245 |
| 900° C./10 min. | 144 | 153 |
| 900° C./10 min. + 1000° C./10 min. | 207 | 221 |

Example 3

In Example 1, the frit content in the silver powder+glass frit mix was changed to 0% and 4.6% by weight.

Using the high-frequency dielectric material paste of Example 1, green sheets were prepared by a doctor blade technique. The aforementioned low melting internal conductor paste was printed on one green sheet by a screen printing technique so as to form a center conductor 3 in the form of a strip line having a line width of 2.0 mm, a line length of $\lambda g/4 = c/(\epsilon r^{1/2}.fr)$ wherein $c=3\times10^8$ m/s, $\epsilon r=11$, and $fr=2\times10^9$ Hz, and a thickness of 30 μm. A plurality of green sheets were formed with viaholes 5 which were filled with the internal conductor. The green sheets were laminated by means of a hot press, yielding a green sheet laminate. The laminate was degreased and then co-fired in air for 10 minutes at the temperature shown in FIG. 13. The green sheets were 160 μm thick. The center conductor was sealed within the green sheets.

Figure 13:
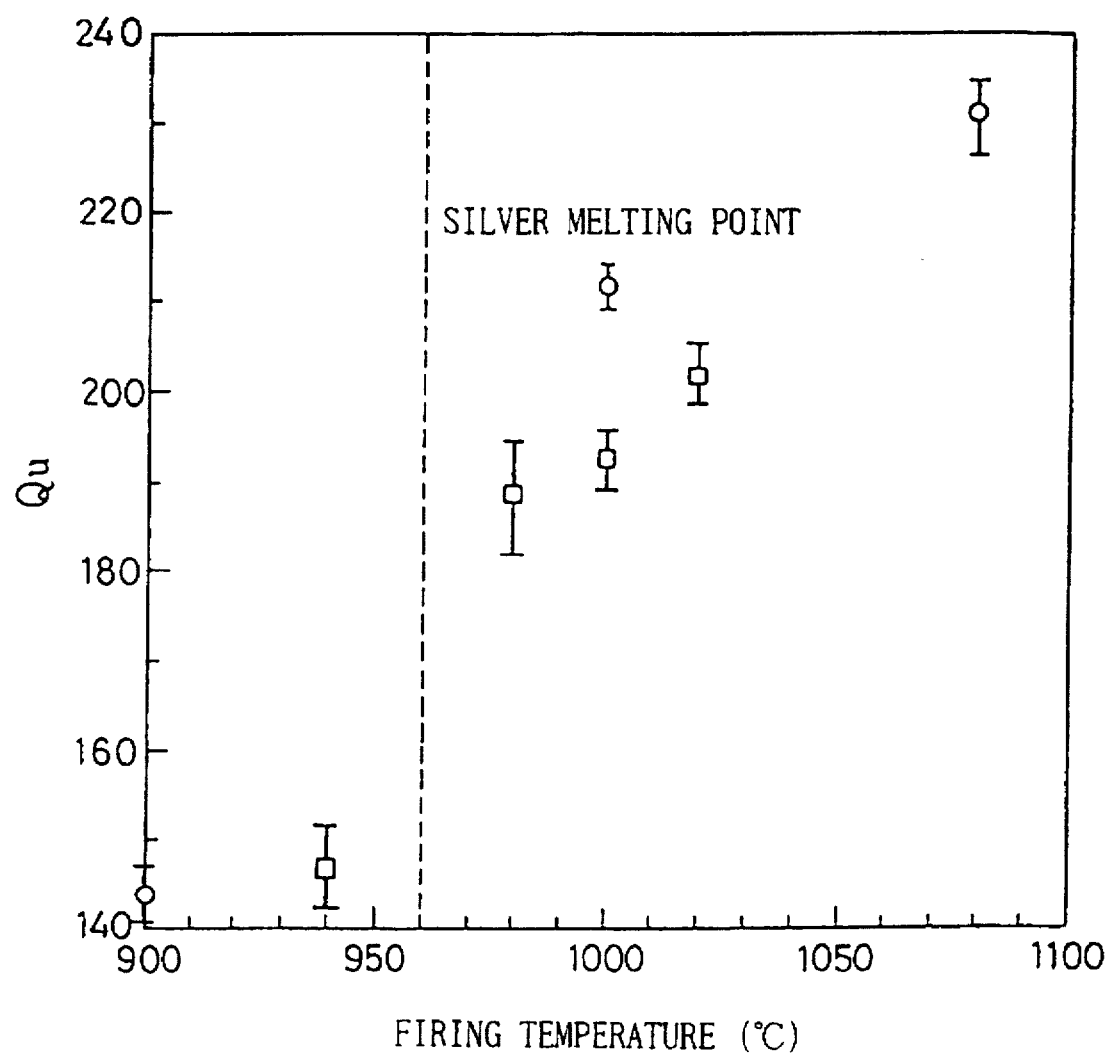
FIG. 13 is a graph showing Qu relative to firing temperature.

Thereafter, the laminate was cut to a predetermined size to expose the center conductor 3 having a predetermined line length at an end face, a silver paste for forming the ground plane 4 was then printed over the entire surface, and the laminate was fired in air at a temperature of 850° C. for 10 minutes, obtaining a tri-plate line resonator formed between the ground planes 4 and 4 which forms a part of the resonator shown in FIG. 1. The size was 10 mm×15 mm×2.0 mm. FIG. 13 shows the Q value (Qu) of the thus fabricated resonator relative to the firing temperature. The plots of FIG. 13 show that Qu is significantly increased by melting the low melting internal conductor.

Further, a resonator having a thickness of 1 to 2.5 mm was fabricated by changing the number of green sheets laminated such that it had dielectric layers 21 of equal thickness above and below the center conductor 3 and entirely covering it with a ground plane.

Figure 14:
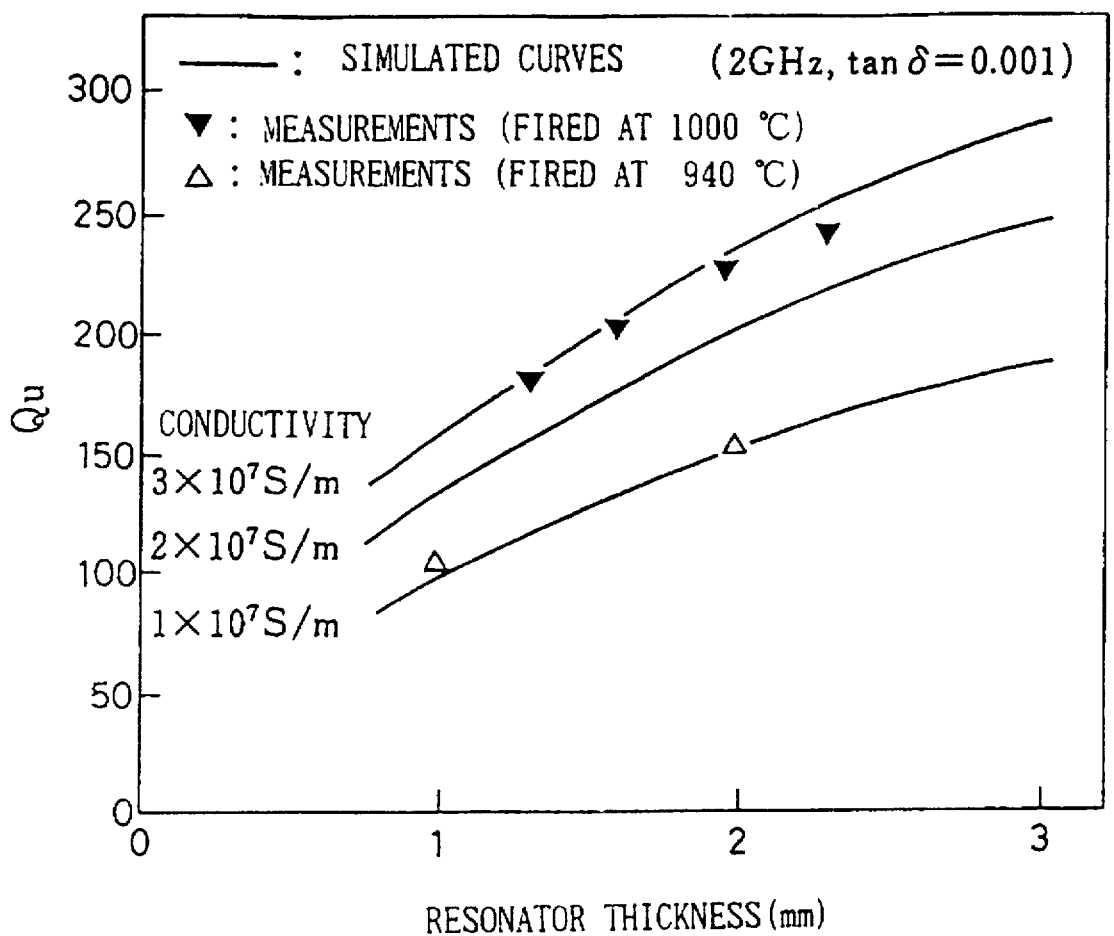
FIG. 14 is a graph showing Qu relative to resonator thickness at different firing temperatures.

Next, Qu simulation was carried out at a center conductor's conductivity of $1\times10^7$ to $3\times10^7$ S/m using the aforementioned conditions of line size, dielectric material's dielectric constant, and fr. Note that pure silver has a conductivity of $6.2\times10^7$ S/M (25° C.). The results of simulated Qu relative to resonator thickness are shown in FIG. 14. Actual measurements for the 4.6 wt % frit sample sintered at temperatures of 1000° C. and 940° C. are also plotted in FIG. 14.

As is evident from the results shown in FIG. 14, the melting of the low melting internal conductor by firing at 1000° C. generally improves the conductivity of the center conductor from about $1\times10^7$ S/m to $3\times10^7$ S/m as compared with firing at 940° C. As a result, Qu is remarkably increased as shown in FIG. 13.

Figure 16A:
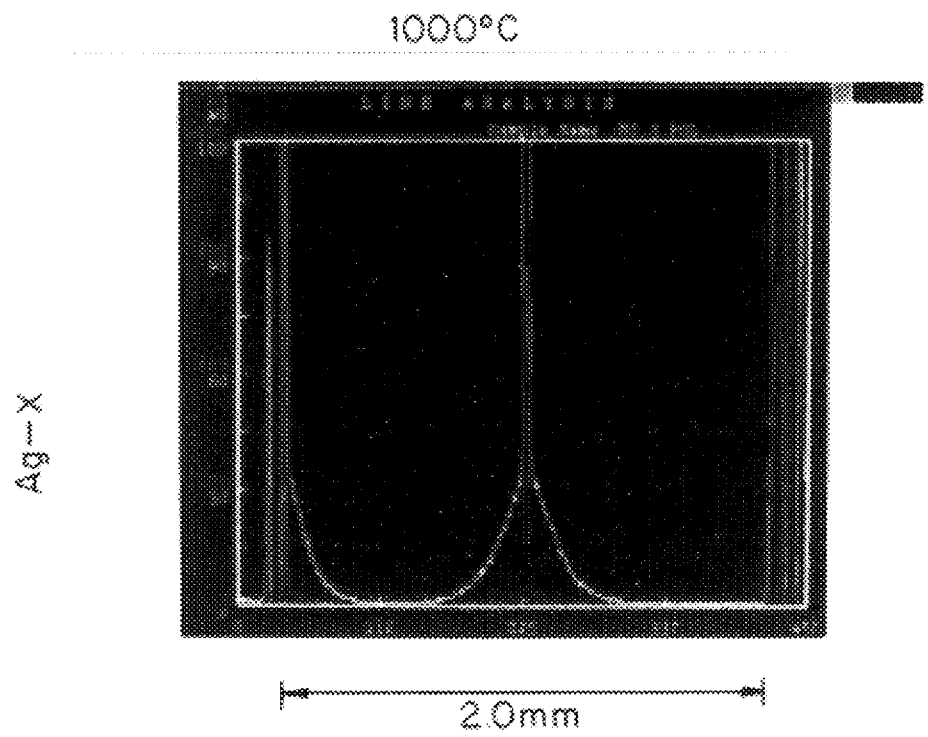
FIG. 16 is a set of photos showing the line analysis intensity of characteristic X rays of the EPMA element distribution pattern of FIG. 15.
Figure 16B:
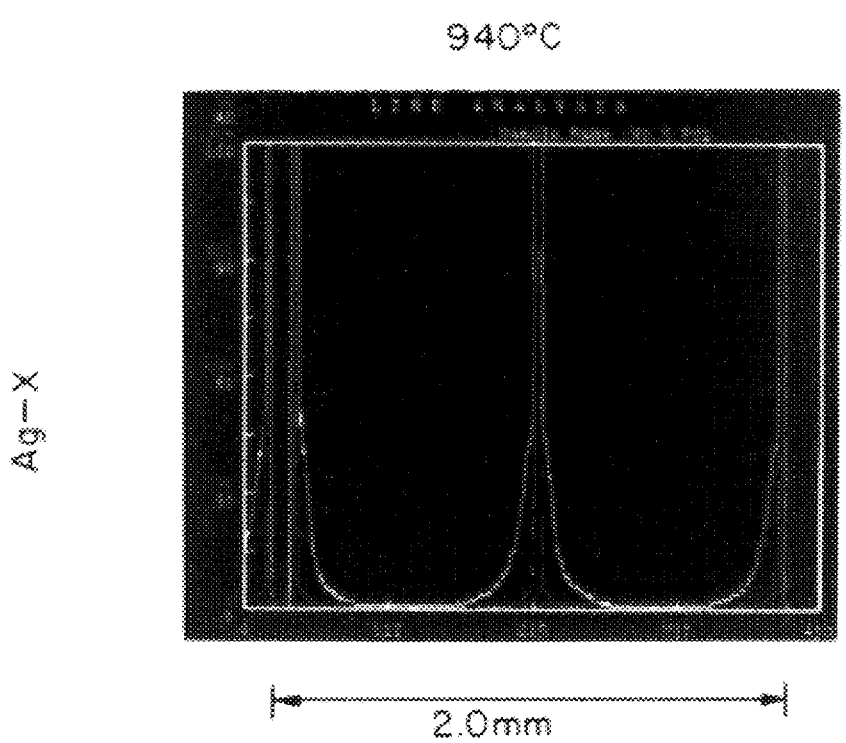

FIG. 15 is a set of photos of EPMA (electron probe microanalyzer) element distribution diagram of a frit containing sample at firing temperatures of 1000° C. and 940° C. FIG. 16 is a set of photos of line analysis intensity of its characteristic X rays. It is seen that firing at 1000° C. leading to higher properties causes greater silver diffusion, but its influence is minimal if the resonator thickness is 2.0 mm.

Example 4

A high melting internal conductor paste was prepared by mixing and dispersing a powder mix of 95% by weight of Ag powder and 5% by weight of Pd powder, a glass frit and a vehicle in a three-roll mill. The Ag powder was spherical having a mean particle size of 3 μm and the Pd powder was spherical having a mean particle size of 1 μm. The glass frit used had a softening point 960° C., the composition:

$SiO_2$: 66.0 mol %
SrO: 15.0 mol %
$Al_2O_3$: 16.0 mol %
$ZrO_2$: 3.0 mol % and a mean particle size of 1.0 μm.

An internal conductor paste was obtained by adding a vehicle to the mixture and kneading the mixture in a three-roll mill. The vehicle used included an acrylic resin binder and a terpineol solvent. The mixing proportion of the respective components was:

| Ag powder | 77.7 wt % |
| Pd powder | 4.1 wt % |
| glass frit | 4.6 wt % |
| organic binder | 3.4 wt % |
| organic solvent | 10.2 wt % |

Using the high-frequency dielectric material paste of Example 1, green sheets (having a thickness of 160 μm at the end of firing) were prepared by a doctor blade technique. The low melting internal conductor paste of Experimental Example was printed on one green sheet by a screen printing technique to form a center conductor 3 of a strip line of Experimental Example 1. The high melting internal conductor paste was printed on green sheets having a plurality of viaholes 5 formed therein to fill the viaholes 5 with the conductor. A ground plane 4 and an internal interconnection 7 were formed such that they were about 20 μm thick at the end of firing. The sheets were laminated by means of a hot press, yielding a green sheet laminate. The laminate was degreased and then co-fired in air for 10 minutes at the temperature above 960° C. employed in Experimental Example 1. The center conductor was sealed within the green sheets.

Thereafter, the laminate was cut to a predetermined size to expose the center conductor 3 at an end face, a silver paste for forming the lower ground plane 4, surface electrode 9 and external electrode 6 was then printed, and the laminate was fired in air at a temperature of 850° C. for 10 minutes, obtaining a substrate having a tri-plate line resonator built therein as shown in FIG. 1. The size was 10 mm×15 mm×2.0 mm (resonating layer thickness 2.0 mm). The thus fabricated substrate was a high performance, compact substrate since it showed a high Q value as in Example 3 and no silver diffusion occurred in the high melting internal conductor despite a small spacing between the internal interconnecting layers of the high melting internal conductor. It is to be noted that the high melting internal conductor layer was a Ag-Pd alloy which had not been melted.

Example 5

A copper base internal conductor paste of the following composition was prepared. Copper has a melting point of 1083° C. and a resistivity of $1.72 \times 10^{-6}$ Ω/cm.

| Conductor paste | |
|---|---|
| Copper powder | mean particle size 3 μm spherical purity 99.9% |
| Glass frit | $SiO_2$—$Al_2O_3$—SrO system (softening point 860° C.) |
| Organic binder | acrylic |
| Organic solvent | terpineol |
| Mixing proportion | |
| glass frit + copper powder | 80 wt % |
| organic binder | 5.0 wt % |
| organic solvent | 15.0 wt % |

These materials are mixed and dispersed in a three-roll mill. A resonator was fabricated by the same procedure as in Example 1 except that this paste was used, the firing atmosphere was argon gas having an oxygen partial pressure of up to $10^{-6}$ atm. in a closed type firing furnace, and copper was also used on the ground side of the resonator. The results are shown in Table 3.

TABLE 3

| Sample No. | Glass frit content, vol % (wt %) | Frit softening point, °C. | Firing temp., °C. | Qu |
|---|---|---|---|---|
| 21 (invention) | 16.8 (5.3) | 860 | 1120 | 226 |
| 22 (comparison) | 16.8 (5.3) | 860 | 980 | 138 |

Simulation under the conditions: line width 2 mm, resonator thickness 2 mm, dielectric material's QF 1000 GHz, line thickness 30 μm, dielectric constant 10.9, line resistivity 1.72E-8 Ω/m (when the line used was silver in bulk), and ground plane resistivity 3.44 Ω/m gave Qu=275.4. A Q value corresponding to 82% of the theoretical value could be obtained in accordance with the present invention.

Example 6

$BaCO_3$, $Nd_2O_3$, $TiO_2$, $Bi_2O_3$, $MnCO_3$, and $Al_2O_3$ were furnished as raw materials and weighed so as to provide the following composition, the weighed amounts of the raw materials were admitted into a ball mill together with water, and wet milling was effected for 4 hours. Then the mass was dewatered and dried and thereafter, calcined at 1280° C. for 2 hours.

| 18.2 mol % BaO-66.7% $TiO_2$-15.1 mol % $Nd_2O_3$ | |
|---|---|
| $BiO_3$ | 7.59 wt % |
| $Al_2O_3$ | 1.0 wt % |
| MnO | 0.5 wt % |

The calcined material was wet milled for 4 hours along with 10 wt % of glass and 1.0 wt % of CuO. The milled material was dried and then combined with an organic binder (polyvinyl alcohol PVA117 manufactured by Kureha Chemical Industry K.K. and acrylic Elvacite manufactured by E. I. DuPont) to form a paste. The glass used had the composition: PbO 66.9 wt %, $B_2O_3$ 14.8 wt %, ZnO 11.6 wt %, $Al_2O_3$ 0.41% and $SiO_2$ 3.83 wt %. The dielectric material had a dielectric constant of 73, QF=2500 GHz, τε=−3.2 pm/°C. as measured on a sintered body.

A conductor paste had the following composition:

| Silver powder | mean particle size 3 μm spherical purity 99.9% |
|---|---|
| Glass frit | $SiO_2$—$Al_2O_3$—SrO system (softening point 860° C.) |
| Organic binder | acrylic |
| Organic solvent | terpineol |
| Mixing proportion | |
| glass frit + silver powder | 90 wt % |
| organic binder | 2.5 wt % |
| organic solvent | 7.5 wt % |

These materials are mixed and dispersed in a three-roll mill.

Using these pastes, a resonator of 2.0 mm×2.0 mm×4.6 mm long having a line width of 1.0 mm was fabricated while using silver as a conductor material on the ground side. The results are shown in Table 4.

TABLE 4

| Sample No. | Glass frit content, vol % (wt %) | Firing conditions | Resonator Qu |
|---|---|---|---|
| 31 | 15.0 (5.4) | 1000° C./10 min. | 242 |
| 41 (comparison) | 15.0 (5.4) | 910° C./10 min. | 147 |

Simulation under the conditions: line width 1 mm, resonator thickness 2 mm, dielectric material's QF 2500 GHz, line thickness 30 μm, dielectric constant 73, line resistivity $1.62 \times 10^{-8}$ Ω/m (when the line used was silver in bulk), and ground plane resistivity 3.44 Ω/m gave Qu=294.8 which corresponded to 82% of the theoretical value.

Example 7

Silver powder of 99.9% purity, a glass frit and a vehicle were mixed and dispersed in a three-roll mill. The silver powder was spherical having a mean particle size of 3 μm. The glass frit used had the composition:

$SiO_2$: 62 mol %

SrO: 26 mol %

$Al_2O_3$: 12 mol % and a mean particle size of 1.0 μm. This glass had a softening point of 860° C.

An internal conductor paste was obtained by adding a vehicle to the mixture and kneading the mixture in a three-roll mill. The vehicle used included an acrylic resin binder and a terpineol solvent. The mixing proportion of the respective components was:

| silver powder | 85.22 wt % |
|---|---|
| glass frit | 4.77 wt % |
| organic binder | 2.5 wt % |
| organic solvent | 7.5 wt % |

Separately, a dielectric material was prepared which contained 70% by volume of glass particles having a mean particle size of 1.9 μm and 30% by volume of $Al_2O_3$ particles having a mean particle size of 1.5 μm. To 100 parts by weight of the dielectric material was added 73 parts by weight of a vehicle. Using a ball mill, the mixture was milled into a slurry. The vehicle used contained an acrylic resin as a binder, ethyl alcohol and toluene as a solvent, and a phthalate ester as a plasticizer. The glass particles had the composition: $SiO_2$ 62 mol %, $Al_2O_3$ 8 mol %, $B_2O_3$ 3 mol %, SrO 20 mol %, CaO 4 mol %, and MgO 3 mol % and a softening point of 815° C.

Using this dielectric material paste, green sheets of 0.25 mm thick were prepared by a doctor blade technique. The aforementioned Ag base internal conductor paste was printed on four green sheets by a screen printing technique to form coils of 3 turns having a line width of 200 μm and interconnected through a viahole, and the sheets were then stacked in a hot press to form a green sheet laminate. The laminate was degreased and then co-fired in air for 30 minutes at the temperature shown in Table 4. The internal conductor was 20 μm thick.

Next, an external electrode-forming Ag paste was printed by a screen printing technique and firing in air at a temperature of 850° C. for 10 minutes yielded a L chip which was dimensioned 2.0 mm×1.2 mm×1 mm.

The thus fabricated L chip was measured for Q value (100 MHz), with the results shown in Table 5. Table 5 also shows the results of another L chip sample which was fabricated in the same manner as above except that a line width of 200 μm, 5 turns, six layers of green sheets were used and it dimensioned 3.2 mm×1.6 mm×1 mm. The benefits of the present invention are evident from the data of Table 5.

TABLE 5

| Sample No. | Number of turns | Firing temp., °C. | Inductance nH | Q (100 MHz) |
| --- | --- | --- | --- | --- |
| 41 (comparison) | 3 | 900 | 10.5 | 17 |
| 42 | 3 | 1000 | 10.5 | 25 |
| 43 (comparison) | 5 | 900 | 51.0 | 21 |
| 44 | 5 | 1000 | 51.0 | 29 |

BENEFITS

The present invention provides a multilayer ceramic substrate which has a dense internal conductor and features improved operating properties of circuits such as resonators, capacitors, inductors, and transmission lines as typified by Q value, with a minimal variation thereof. Size reduction is also possible.

We claim:

1. A method for preparing a multilayer ceramic part having a fired ceramic material and an internal conductive layer formed from a conductive powder, which method comprises:

firing a body, said body comprising an unfired ceramic material and an internal layer of conductive powder, at a temperature equal to or greater than the melting point of said conductive powder, thereby concurrently firing said ceramic material and melting said conductive powder;

wherein said conductive powder comprises at least 90% by weight of copper or silver and 0–30% by volume of glass frit.

2. The method according to claim 1, wherein said firing is performed at a temperature up to 300° C. above the melting point of said conductive powder.

3. The method according to claim 1, wherein substantially no grain boundaries are observed between the conductive grains in said internal conductive layer when an end face of said internal conductive layer is exposed by cutting and etching and observing under a scanning electron microscope.

4. The method according to claim 1, wherein said internal conductive layer is a continuous internal conductive layer in said multilayer ceramic part.

5. The method according to claim 4, wherein said conductive powder contains up to 30% by volume of glass frit, and wherein said glass frit is excreted from said continuous internal conductive layer upon firing.

6. The method according to claim 1, wherein said conductive powder contains no glass frit.

7. The method according to claim 1, wherein said internal layer of conductive powder is formed by printing a conductive paste containing 60–95% by weight of said conductive powder onto said unfired ceramic material.

8. The method according to claim 1, wherein said fired ceramic material contains a ceramic oxide.

9. The method according to claim 1, wherein said fired ceramic material contains an oxide aggregate and a glass.

10. The method according to claim 1, wherein said conductive powder comprises at least two conductive powders having different melting points.

11. The method according to claim 10, wherein said multilayer ceramic part has a surface portion and a higher melting internal conductive layer connecting the lower melting internal conductive layer to the surface portion.

12. The method according to claim 10, wherein said firing is performed at a temperature between the melting points of the lower melting conductive powder and the higher melting conductive powder.

13. The method according to claim 12, wherein said lower melting conductive powder contains at least 90% by weight silver.

14. The method according to claim 12, wherein said lower melting conductive powder forms a continuous lower melting conductive layer in said internal conductive layer upon firing.

15. The method according to claim 14, wherein said glass frit is excreted outside of the continuous lower melting conductive layer upon said firing.

16. A method for preparing a multilayer ceramic part having a fired ceramic material, at least one lower melting internal conductive layer formed from a conductive powder having a lower melting point, and at least one higher melting internal conductive layer formed from a conductive powder having a higher melting point, which method comprises:

firing a body, said body comprising an unfired ceramic material, at least one internal layer of lower melting conductive powder, and at least one internal layer of higher melting conductive powder;

wherein said firing is at a temperature equal to or greater than the melting point of said lower melting conductive powder, thereby concurrently firing said ceramic material and melting said lower melting conductive powder, wherein substantially no grain boundaries are observed between conductive grains in said lower melting internal conductive layer when an end face of said lower melting internal conductive layer is exposed by cutting and etching and observing under a scanning electron microscope.

17. The method according to claim 16, wherein said body has a first layer of unfired ceramic material disposed between an internal layer of lower melting conductive powder and a layer of higher melting conductive powder, and a second layer of unfired ceramic material disposed between two internal layers of higher melting conductive powder;

wherein, upon said firing, the first layer of fired ceramic material is thicker than the second layer of fired ceramic material.

18. The method according to claim 16, wherein said lower melting conductive powder contains at least 90% by weight of silver.

* * * * *

UNITED STATES PATENT AND TRADEMARK OFFICE
CERTIFICATE OF CORRECTION

PATENT NO.   : 5,785,879
DATED        : July 28, 1998
INVENTOR(S)  : Keizou Kawamura et al.

It is certified that error appears in the above-identified patent and that said Letters Patent is hereby corrected as shown below:

Title page,
Item [30], the Foreign Application Priority Data, is missing. It should read:

-- Oct. 25, 1991   [JP]   Japan.....................3-306760 --
-- Apr. 27, 1992   [JP]   Japan.....................4-134199 --

Signed and Sealed this

Nineteenth Day of February, 2002

Attest:

Attesting Officer

JAMES E. ROGAN
Director of the United States Patent and Trademark Office